(12) United States Patent
Chung et al.

(10) Patent No.: US 10,804,264 B2
(45) Date of Patent: Oct. 13, 2020

(54) INTEGRATED CIRCUIT DEVICE

(71) Applicant: Samsung Electronics Co., Ltd., Suwon-si, Gyeonggi-do (KR)

(72) Inventors: Jae-yup Chung, Yongin-si (KR); Il-ryong Kim, Seongnam-si (KR); Ju-youn Kim, Suwon-si (KR); Jin-wook Kim, Hwaseong-si (KR); Kyoung-hwan Yeo, Seoul (KR); Yong-gi Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/170,774

(22) Filed: Oct. 25, 2018

(65) Prior Publication Data
US 2019/0319027 A1 Oct. 17, 2019

(30) Foreign Application Priority Data
Apr. 11, 2018 (KR) .................. 10-2018-0042197

(51) Int. Cl.
*H01L 27/088* (2006.01)
*H01L 27/02* (2006.01)
(Continued)

(52) U.S. Cl.
CPC .... *H01L 27/0886* (2013.01); *H01L 21/02532* (2013.01); *H01L 21/76224* (2013.01); *H01L 21/823412* (2013.01); *H01L 21/823431* (2013.01); *H01L 21/823481* (2013.01); *H01L 21/823814* (2013.01);
(Continued)

(58) Field of Classification Search
CPC ........ H01L 21/02532; H01L 21/76224; H01L 21/823412; H01L 21/823431; H01L 21/823481; H01L 21/823814; H01L 21/823821; H01L 27/0886; H01L 27/0207; H01L 27/0924; H01L 29/0649; H01L 29/0847; H01L 29/165; H01L 29/66636; H01L 21/02271; H01L 21/0228; H01L 21/02529; H01L 21/31051;
(Continued)

(56) References Cited

U.S. PATENT DOCUMENTS 8,878,309 B1 * 11/2014 Hong .............. H01L 21/823481
257/401
8,916,460 B1 * 12/2014 Kwon ................... H01L 21/845
438/595

(Continued)

*Primary Examiner* — Mark W Tornow
(74) *Attorney, Agent, or Firm* — Harness, Dickey & Pierce, P.L.C.

(57) ABSTRACT

An integrated circuit device includes a substrate from which a plurality of fin-type active regions protrude, the plurality of fin-type active regions extending in parallel to one another in a first direction, and a plurality of gate structures and a plurality of fin-isolation insulating portions extending on the substrate in a second direction crossing the first direction and at a constant pitch in the first direction, wherein a pair of fin-isolation insulating portions from among the plurality of fin-isolation insulating portions are between a pair of gate structures from among the plurality of gate structures, and the plurality of fin-type active regions include a plurality of first fin-type regions and a plurality of second fin-type regions.

20 Claims, 52 Drawing Sheets

(51) Int. Cl.
| | |
|---|---|
| H01L 29/66 | (2006.01) |
| H01L 21/02 | (2006.01) |
| H01L 29/165 | (2006.01) |
| H01L 21/8234 | (2006.01) |
| H01L 21/8238 | (2006.01) |
| H01L 27/092 | (2006.01) |
| H01L 21/762 | (2006.01) |
| H01L 29/08 | (2006.01) |
| H01L 29/06 | (2006.01) |
| H03K 19/0948 | (2006.01) |
| H01L 21/3105 | (2006.01) |
| H01L 21/311 | (2006.01) |
| H01L 21/3213 | (2006.01) |

(52) U.S. Cl.
CPC ........... *H01L 21/823821* (2013.01); *H01L 21/823878* (2013.01); *H01L 27/0207* (2013.01); *H01L 27/0924* (2013.01); *H01L 29/0649* (2013.01); *H01L 29/0847* (2013.01); *H01L 29/165* (2013.01); *H01L 29/66636* (2013.01); *H01L 21/0228* (2013.01); *H01L 21/02271* (2013.01); *H01L 21/02529* (2013.01); *H01L 21/31051* (2013.01); *H01L 21/31116* (2013.01); *H01L 21/32135* (2013.01); *H01L 21/823462* (2013.01); *H01L 21/823857* (2013.01); *H01L 29/66545* (2013.01); *H03K 19/0948* (2013.01).

(58) Field of Classification Search
CPC ......... H01L 21/31116; H01L 21/32135; H01L 21/823462; H01L 21/823857
See application file for complete search history.

(56) References Cited

U.S. PATENT DOCUMENTS

| | | | |
|---|---|---|---|
| 9,653,583 B1* | 5/2017 | Zhao | ............... H01L 29/66795 |
| 9,721,950 B2 | 8/2017 | You et al. | |
| 9,761,495 B1 | 9/2017 | Xie et al. | |
| 2013/0187237 A1* | 7/2013 | Yu | ................... H01L 21/823807 |
| | | | 257/369 |
| 2014/0151810 A1* | 6/2014 | Maeda | ............... H01L 29/1037 |
| | | | 257/365 |
| 2017/0062420 A1 | 3/2017 | You et al. | |
| 2017/0062475 A1 | 3/2017 | Song et al. | |
| 2017/0317078 A1 | 11/2017 | Chang et al. | |
| 2017/0338228 A1 | 11/2017 | Huang et al. | |
| 2017/0358584 A1 | 12/2017 | Wang et al. | |
| 2017/0373144 A1 | 12/2017 | Pandey | |
| 2018/0006035 A1 | 1/2018 | Yuan et al. | |
| 2018/0006135 A1 | 1/2018 | Shen | |

* cited by examiner

X1 − X1'

X1 - X1'

X1 – X1'

X1 – X1'

X1 – X1'

X2 - X2'

INTEGRATED CIRCUIT DEVICE

CROSS-REFERENCE TO RELATED APPLICATION

This application claims the benefit of Korean Patent Application No. 10-2018-0042197, filed on Apr. 11, 2018, in the Korean Intellectual Property Office, the disclosure of which is incorporated herein in its entirety by reference.

BACKGROUND

Inventive concepts relate to an integrated circuit device, and more particularly, to an integrated circuit device including a fin-type active region.

With developments in electronic technologies, integrated circuit devices have been rapidly down-scaled. For highly integrated circuit devices, not only a high operational speed, but also an operational accuracy is needed. Thus, development of an integrated circuit device which has a structure capable of reducing an area occupied by wires and contacts to a relatively small area of the integrated circuit device and stably obtaining an insulation distance between the wires and the contacts is desired. Also, a method of realizing such an integrated circuit device is desired.

SUMMARY

Inventive concepts provides an integrated circuit device having a structure including transistors capable of providing an improved performance, even when an area of an element region is reduced due to down-scaling of the integrated circuit device.

According to some example embodiments of inventive concepts, there is provided an integrated circuit device including a substrate, a plurality of fin-type active regions protruding from the substrate, the plurality of fin-type active regions extending in parallel to one another in a first direction, and a plurality of gate structures and a plurality of fin-isolation insulating portions extending on the substrate in a second direction crossing the first direction, the plurality of gate structures and the plurality of fin-isolation portions at a constant pitch in the first direction. A pair of fin-isolation insulating portions from among the plurality of fin-isolation insulating portions are between a first element of a pair of gate structures and a second element from the pair of gate structures, the pair of gate structures being from among the plurality of gate structures. The plurality of fin-type active regions comprise a plurality of first fin-type regions and a plurality of second fin-type regions, wherein a pair of first fin-type regions from among the plurality of first fin-type regions extend in a straight line in the first direction and are spaced apart from each other with the pair of fin-isolation insulating portions therebetween, and one of the plurality of second fin-type regions is between the pair of fin-isolation insulating portions.

According to some example embodiments of inventive concepts, there is provided a n integrated circuit device including a substrate, a plurality of fin-type active regions protruding from the substrate, the plurality of fin-type active regions having a first region and a second region, the plurality of fin-type active regions extending in parallel to one another in a first direction, and a plurality of gate structures and a plurality of fin-isolation insulating portions extending on the substrate in a second direction crossing the first direction, the plurality of gate structures and the plurality of fin-isolation insulating portions at a constant pitch in the first direction. A pair of fin-isolation insulating portions from among the plurality of fin-isolation insulating portions are between a first element and a second element of a pair of gate structures from among the plurality of gate structures. The plurality of fin-isolation insulating portions comprise a first fin-isolation insulating portion in the first region and a second fin-isolation insulating portion in the second region, wherein at least a portion of the first fin-isolation insulating portion has a different material from at least a portion of the second fin-isolation insulating portion.

According to some example embodiments of inventive concepts, there is provided an integrated circuit device including a substrate, a plurality of fin-type active regions protruding from the substrate, the plurality of fin-type active regions having a first region and a second region and extending in parallel to one another in a first direction, and a plurality of gate structures and a plurality of fin-isolation insulating portions extending on the substrate in a second direction crossing the first direction and at a constant pitch in the first direction. A pair of fin-isolation insulating portions from among the plurality of fin-isolation insulating portions are between a first element and a second element of a pair of gate structures from among the plurality of gate structures in the first region. One fin-isolation insulating portion from among the plurality of fin-isolation insulating portions is between a pair of gate structures from among the plurality of gate structures in the second region.

BRIEF DESCRIPTION OF THE DRAWINGS

Some example embodiments of inventive concepts will be more clearly understood from the following detailed description taken in conjunction with the accompanying drawings in which:

FIGS. 3A and 3B through FIGS. 16A, 16B, and 16C are cross-sectional views for describing a method of manufacturing an integrated circuit device, according to some example embodiments, the cross-sectional views being illustrated in a sequential order of the method;

DETAILED DESCRIPTION OF EXAMPLE EMBODIMENTS

Figure 1:
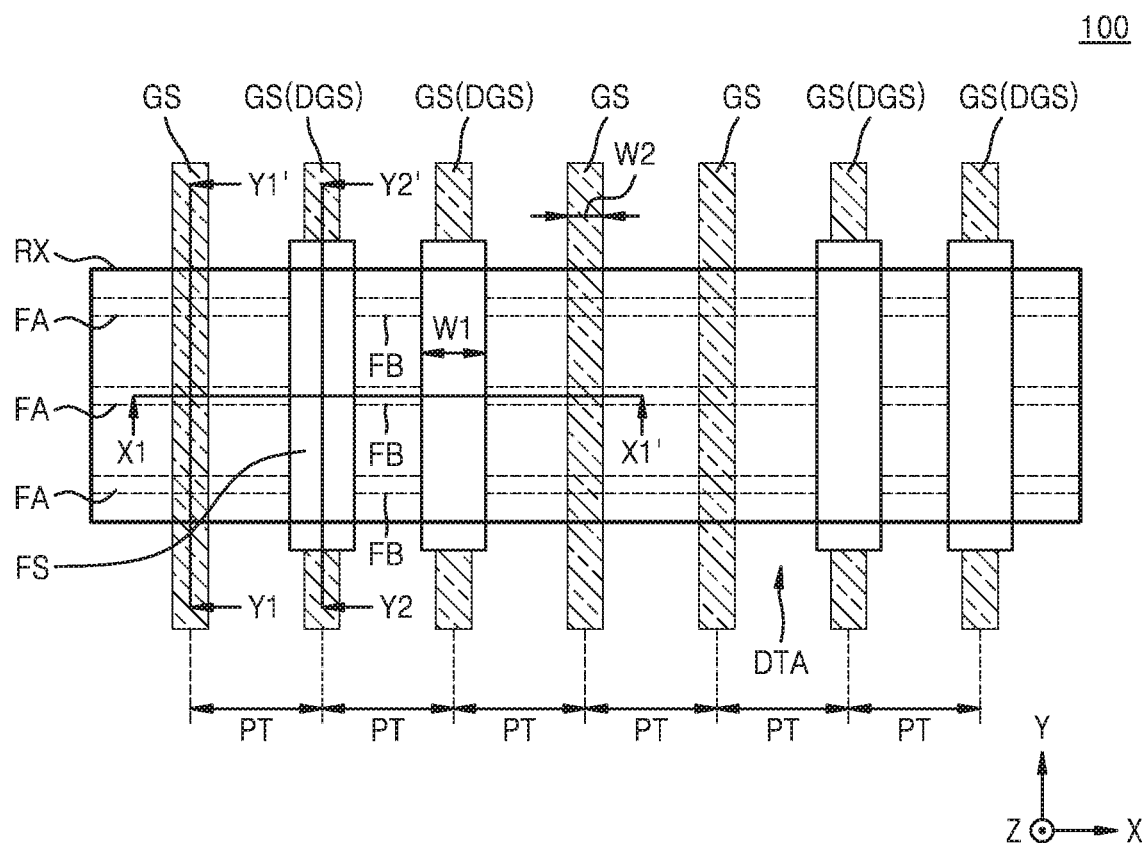
FIG. 1 is a planar layout diagram for describing an integrated circuit device according to some example embodiments.
Figure 2A:
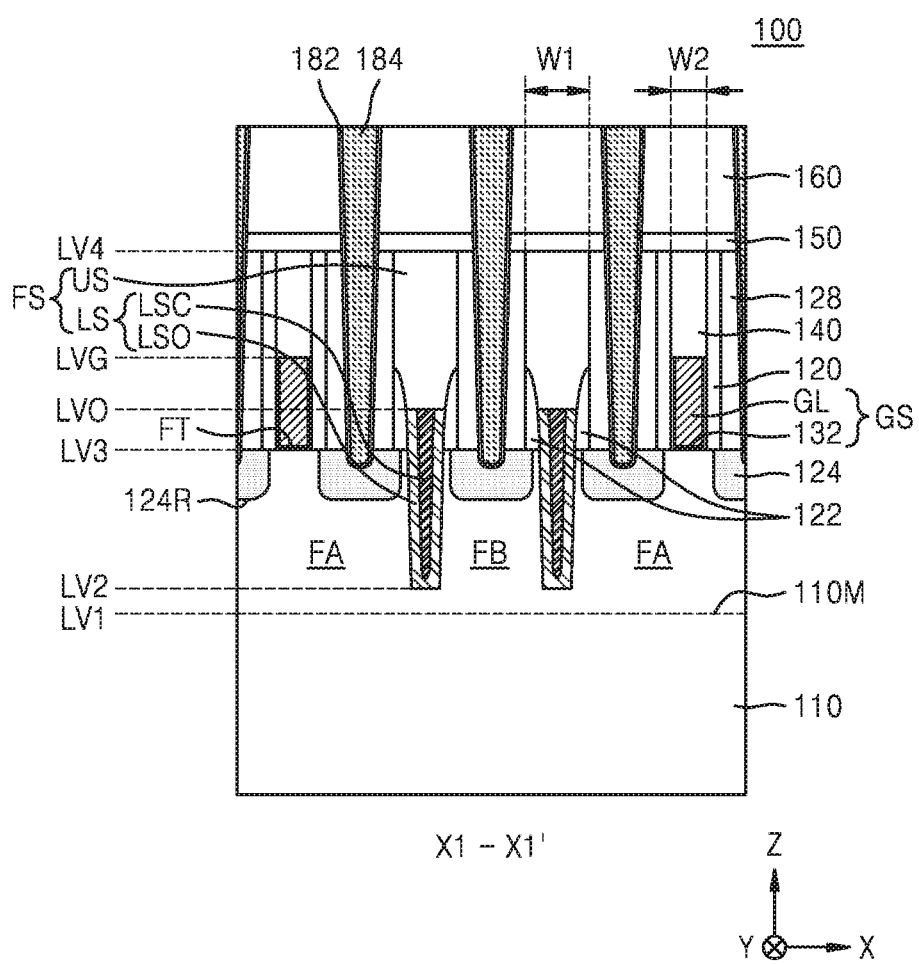
FIG. 2A is a cross-sectional view for describing an integrated circuit device according to some example embodiments.

FIG. 1 is a planar layout diagram for describing an integrated circuit device 100 according to some example embodiments, and FIG. 2A is a cross-sectional view for describing the integrated circuit device 100 according to some example embodiments. FIG. 2A is an example cross-sectional view taken along a line X1-X1' of FIG. 1.

Referring to FIGS. 1 and 2A, the integrated circuit device 100 may include a fin field-effect transistor (FinFET) device. The FinFET device may include a logic cell. The logic cell may be variously formed and include a plurality of circuit elements, such as transistors, registers, etc. The logic cell may include, for example, AND, NAND, OR, NOR, exclusive OR (XOR), exclusive NOR (XNOR), an inverter (INV), an adder (ADD), a buffer (BUF), delay (DLY), a filter (FIL), a multiplexer (MXT/MXIT), or/and/inverter (OAI), and/or (AO), and/or/inverter (AOI), a D flip-flop, a reset flip-flop, a master-slave flip-flop, a latch, and/or other elements, and the logic cell may include standard cells performing desired logic functions, such as a counter, a buffer, and/or other elements.

The integrated circuit device 100 may further include a substrate 110 having an element region RX, and a plurality of fin-type active regions FA and FB protruding from the substrate 110 in the element region RX. The substrate 110 may have a first surface 110M extending at a vertical level LV1 in a horizontal direction (an X-Y plane direction). The substrate 110 may include a semiconductor, such as Si or Ge, or a compound semiconductor, such as SiGe, SiC, GaAs, InAs, or InP. The substrate 110 may further include a conductive region. For example, the substrate 110 may include a well doped with impurities or a structure doped with impurities.

A deep trench (refer to DT of FIG. 3B) may be formed in the substrate 110 around the element region RX, and an element-isolation region DTA may be formed on the deep trench DT.

The plurality of fin-type active regions FA and FB may extend in parallel to each other in a first direction (an X direction). As illustrated in FIG. 3B, an element-isolation layer 112 may be formed on the substrate 110 in an area between the plurality of fin-type active regions FA and FB, and in the element-isolation region DTA. The plurality of fin-type active regions FA and FB may protrude above the element-isolation layer 112 as a fin shape in the element region RX.

The element-isolation layer 112 may include, for example, a silicon oxide layer. However, inventive concepts are not limited thereto. In some example embodiments, the element-isolation layer 112 may include a first insulating liner, a second insulating liner, and a buried insulating layer that are sequentially stacked on the substrate 110.

In some example embodiments, the first insulating liner may include a first oxide layer. The first oxide layer may be obtained by a deposition process or by thermally oxidizing surfaces of the plurality of fin-type active regions FA and FB. In some example embodiments, the second insulating liner may include silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), polysilicon, or a combination thereof, but inventive concepts are not limited thereto. In some example embodiments, the buried insulating layer may include a second oxide layer. The second oxide layer may include a layer formed by a deposition process or a coating process. For example, the second oxide layer may include fluoride silicate glass (FSG), undoped silicate glass (USG), boro-phospho-silicate glass (BPSG), phospho-silicate glass (PSG), flowable oxide (FOX), plasma enhanced tetraethyl-ortho-silicate (PE-TEOS), and/or tonen silazene (TOSZ), but inventive concepts are not limited thereto.

A plurality of gate structures GS may extend on the substrate 110 in a second direction (a Y direction) crossing the plurality of fin-type active regions FA and FB. The plurality of gate structures GS may have the same width in the first direction (the X direction), and may be at a constant pitch PT in the first direction (the X direction). Each of the plurality of gate structures GS may include a stack of a gate insulating layer 132 and a gate line GL. The gate insulating layer 132 may cover a bottom surface and both side walls of the gate line GL.

The plurality of gate structures GS may extend to cover a top surface and both side walls of each of the plurality of fin-type active regions FA and FB and a top surface of the element-isolation layer 112. A plurality of metal-oxide-semiconductor (MOS) transistors may be formed in the element region RX along the plurality of gate structures GS. Each of the plurality of MOS transistors may be a three-dimensional (3d) MOS transistor having channels at the top surfaces and the both side walls of the plurality of fin-type active regions FA and FB.

One or more of the plurality of gate structures GS may include a plurality of dummy gate structure DGS. The plurality of dummy gate structures DGS may include a stack of the gate insulating layer 132 and the gate line GL. However, the dummy gate structures DGS may maintain an electric floating state during an operation of the integrated circuit device 100. In some example embodiments, the dummy gate structures DGS may be omitted.

The plurality of gate insulating layers 132 may include a silicon oxide layer, a high-k dielectric layer, or a combination thereof. The high-k dielectric layer may include a material having a higher dielectric constant than a material of a silicon oxide layer. The high-k dielectric layer may include a metal oxide and/or a metal oxynitride. An interface layer may be interposed between the fin-type active regions FA and FB and the gate insulating layer 132. The interface layer may include an oxide layer, a nitride layer, or an oxynitride layer.

The plurality of gate lines GL may have a structure of a metal nitride layer, a metal layer, a conductive capping layer, and a gap-fill metal layer that are sequentially stacked. The metal nitride layer and the metal layer may include at least one metal selected from Ti, Ta, W, Ru, Nb, Mo, and Hf. The gap-fill metal layer may include a W layer or an Al layer. Each of the plurality of gate lines GL may include a work-function metal-containing layer. The work-function metal-containing layer may include at least one metal selected from Ti, W, Ru, Nb, Mo, Hf, Ni, Co, Pt, Yb, Tb, Dy, Er, and Pd. In some example embodiments, each of the plurality of gate lines GL may include a stack of TiAlC/TiN/W, a stack of TiN/TaN/TiAlC/TiN/W, or a stack of TiN/TaN/TiN/TiAlC/TiN/W, but is not limited thereto.

A top surface of the plurality of gate structures GS may be covered by a plurality of gate insulating capping layers 140. The plurality of gate insulating capping layers 140 may include a silicon nitride layer.

A plurality of fin-isolation insulating portions FS may extend on the substrate 110 in parallel to one another in the second direction (the Y direction). A pair of fin-isolation insulating portions FS spaced apart from each other may be between a pair of gate structures GS, in the element region RX. The plurality of fin-isolation insulating portions FS may extend long in the second direction (the Y direction) in the element region RX. Two gate structures GS and two fin-isolation insulating portions FS may be alternately in the first direction (the X direction) in the element region RX.

A pair of dummy gate structures DGS extending in a straight line may be at both external sides of the element region RX in the second direction (the Y direction) with one fin-isolation insulating portion FS therebetween. Thus, in the element region RX, the plurality of gate structures GS and the plurality of fin-isolation insulating portions FS may be at a constant pitch PT in the first direction (the X direction) and two gate structures GS and two fin-isolation insulating portions FS may be alternately in the first direction (the X direction).

The fin-isolation insulating portions FS may be at a side of the plurality of gate structures GS around which the plurality of MOS transistors are formed. The fin-isolation insulating portions FS may be at an external side of each of two adjacent gate structures GS. The fin-isolation insulating portions FS may apply a tensile stress or a compressive stress to channel regions of the fin-type active regions FA and FB adjacent to the fin-isolation insulating portions FS. Thus, the stress due to the fin-isolation insulating portions FS may be applied to the plurality of MOS transistors formed along each of the two-adjacent gate structures GS, to boost or degrade the characteristic of each of the plurality of MOS transistors.

The fin-isolation insulating portion FS may include a lower fin-isolation insulating portion LS and an upper fin-isolation insulating portion US located on the lower fin-isolation insulating portion LS. At least a portion of the upper fin-isolation insulating portion US may have a different material from at a least a portion of the lower fin-isolation insulating portion LS. The upper fin-isolation insulating portion US and the lower fin-isolation insulating portion LS may be aligned in a vertical direction (a Z direction) with respect to each other. The lower fin-isolation insulating portion LS may protrude from the upper fin-isolation insulating portion US toward the substrate 110. The lower fin-isolation insulating portion LS may not be in the element-isolation region DTA. A bottom surface of the upper fin-isolation insulating portion US and a top surface of the lower fin-isolation insulating portion LS may contact each other. The gate structures GS may not be located in an upward direction (the Z direction) of the lower fin-isolation insulating portion LS. Rather, the upper fin-isolation insulating portion US may be located in the upward direction (the Z direction) of the lower fin-isolation insulating portion LS. The lower fin-isolation insulating portion LS may include a core insulating pattern LSC, and a peripheral insulating pattern LSO covering a side surface and a bottom surface of the core insulating pattern LSC. The core insulating pattern LSC and the peripheral insulating pattern LSO may include a different material from each other.

In some example embodiments, the peripheral insulating pattern LSO may include a nitride layer, and the core insulating pattern LSC and the upper fin-isolation insulating portion US may include an oxide layer. The core insulating pattern LSC and the upper fin-isolation insulating portion US may be formed by a different deposition process from each other. For example, the core insulating pattern LSC may be or include an oxide layer formed by an atomic layer deposition (ALD) process, and the upper fin-isolation insulating portion US may be or include an oxide layer formed by a chemical vapor deposition (CVD) process.

The upper fin-isolation insulating portion US may be formed as a single-layered structure including a single material, e.g. a homogenous material, but inventive concepts are not limited thereto. In some example embodiments, the upper fin-isolation insulating portion US may have a multi-layered structure in which a plurality of insulating patterns are sequentially stacked. For example, the upper fin-isolation insulating portion US may have a multi-layered structure in which at least two silicon oxide patterns formed by different deposition methods from each other are sequentially stacked. For example, the upper fin-isolation insulating portion US may have a structure in which at least two silicon oxide patterns formed by a CVD process are stacked on a silicon oxide pattern formed by an ALD process.

The lower fin-isolation insulating portion LS may be located between the vertical level LV1 of the first surface 110M of the substrate 110 and a vertical level LVG of an uppermost surface of the gate structure GS. A vertical level LV2 of a lowermost surface of the lower fin-isolation insulating portion LS may be higher than the vertical level LV1 of the first surface 110M of the substrate 110, and may be lower than a vertical level LV3 of an uppermost surface FT of the fin-type active regions FA and FB. Also, a vertical level LVO of an uppermost surface of the lower fin-isolation insulating portion LS may be higher than the vertical level LV3 of the uppermost surface FT of the fin-type active regions FA and FB and may be lower than the vertical level LVG of the uppermost surface of the gate structure GS. In some example embodiments, the vertical level LVO of the uppermost surface of the lower fin-isolation insulating portion LS may be lower than a vertical level of an uppermost end of a plurality of second insulating spacers 122.

The vertical level LVO of the lowermost surface of the upper fin-isolation insulating portion US may be higher than the vertical level LV3 of the uppermost surface FT of the fin-type active regions FA and FB and may be lower than the vertical level LVG of the uppermost surface of the gate structure GS. Also, a vertical level LV4 of an uppermost surface of the upper fin-isolation insulating portion US may be higher than the vertical level LVG of the uppermost surface of the gate structure GS. In some example embodiments, the vertical level LVO of the lowermost surface of the upper fin-isolation insulating portion US may be lower than the vertical level of the uppermost end of the plurality of second insulating spacers 122.

In some example embodiments, top surfaces of the upper fin-isolation insulating portion US, the plurality of gate insulating capping layers 140, a plurality of first insulating spacers 120, and an inter-gate insulating layer 128 may be co-planar. For example, the top surfaces of the upper fin-isolation insulating portion US, the plurality of gate insulating capping layers 140, the plurality of first insulating spacers 120, and the inter-gate insulating layer 128 may have substantially the same vertical level LV4.

A width W1 of the fin-isolation insulating portions FS in the first direction (the X direction) may be greater than a width W2 of the gate structures GS. In detail, a width of the lower fin-isolation insulating portion LS may be substantially the same as or less than the width W2 of the gate structures GS, while the width W1 of an upper portion of the upper fin-isolation insulating portion US may be greater than the width W2 of the gate structures GS.

The plurality of fin-type active regions FA and FB may include a plurality of first fin-type regions FA extending in parallel to one another in the first direction (the X direction) outside two adjacent fin-isolation insulating portions FS, and a plurality of second fin-type regions FB extending in parallel to one another in the first direction (the X direction) between the two adjacent fin-isolation insulating portions FS.

The plurality of first fin-type regions FA and the plurality of second fin-type regions FB may become separated from a plurality of preliminary fin-type active regions (F2 of FIGS. 3A and 3B) during a process of forming the fin-isolation insulating portions FS. The first fin-type regions FA and the second fin-type regions FB extending in a straight line in the first direction (the X direction) may be spaced apart from each other with the fin-isolation insulating portions FS therebetween.

The plurality of fin-type active regions FA and FB may include a pair of first fin-type regions FA spaced apart from each other with a pair of fin-isolation insulating portions FS therebetween, and one second fin-type region FB between the pair of fin-isolation insulating portions FS, the pair of first fin-type regions FA and the second fin-type region FB extending in a straight line in the first direction (the X direction).

The plurality of gate structures GS may not be on the plurality of second fin-type regions FB. Thus, the MOS transistor may not be formed on the plurality of second fin-type regions FB.

The plurality of gate structures GS may include a pair of dummy gate structures DGS extending in a straight line in the second direction (the Y direction) and spaced apart from each other in the second direction (the Y direction) with the fin-isolation insulating portions FS therebetween.

The plurality of first insulating spacers 120 may cover both side walls of the plurality of gate structures GS. The plurality of first insulating spacers 120 may extend in a line shape in the second direction (the Y direction), together with the plurality of gate structures GS. The plurality of second insulating spacers 122 may cover both side walls of the plurality of fin-isolation insulating portions FS. The plurality of second insulating spacers 122 may extend in a line shape in the second direction (the Y direction) together with the plurality of fin-isolation insulating portions FS. The plurality of first insulating spacers 120 and the plurality of second insulating spacers 122 may include a silicon nitride layer, a SiOCN layer, a SiCN layer, or a combination thereof.

A length, for example, a height, of the plurality of second insulating spacers 122 in a vertical direction (the Z direction) may be different from a length of the plurality of first insulating spacers 120 in the vertical direction (the Z direction). In some example embodiments, the length of the plurality of second insulating spacers 122 in the vertical direction (the Z direction) may be less than the length of the plurality of first insulating spacers 120 in the vertical direction (the Z direction). A vertical level of an uppermost surface of the plurality of second insulating spacers 122 may be lower than a vertical level of an uppermost surface of the plurality of first insulating spacers 120. A vertical level of a lowermost surface of the plurality of second insulating spacers 122 may be equal to a vertical level of a lowermost surface of the plurality of first insulating spacers 120.

FIG. 2A illustrates that a bottom surface of the fin-isolation insulating portions FS is flat. However, inventive concepts are not limited thereto. In some example embodiments, the bottom surface of the fin-isolation insulating portions FS may include a curved surface including a portion of a circle or a portion of an oval. In other embodiments, the bottom surface of the fin-isolation insulating portions FS may include a non-planar surface having a point sharply projecting toward the substrate 110.

A recess 124R may be formed at both sides of the gate structures GS and at both sides of the fin-isolation insulating portions FS in the plurality of fin-type active regions FA and FB, and a plurality of recesses 124R may be formed in each of the plurality of fin-type active region FA and FB. The plurality of recesses 124R may be filled with a plurality of source/drain regions 124. The plurality of source/drain regions 124 may be located on the plurality of fin-type active regions FA and FB at both sides of the gate structures GS and both sides of the fin-isolation insulating portions FS. In some example embodiments, the plurality of source/drain regions 124 may have an embedded SiGe structure including a plurality of SiGe layers that are epitaxially grown. The plurality of SiGe layers may each have a different Ge content. In other embodiments, the plurality of source/drain regions 124 may include an epitaxially grown Si layer or an epitaxially grown SiC layer.

In some example embodiments, the plurality of source/drain regions 124 may be covered by an insulating liner. The insulating liner may conformally cover the element-isolation layer 112, the plurality of first insulating spacers 120, and the plurality of source/drain regions 124. The insulating liner may include a silicon nitride layer.

The source/drain region 124 and the gate structure GS may be insulated from each other by the first insulating spacer 120 interposed between the source/drain region 124 and the gate structure GS. The source/drain region 124 may include a semiconductor layer epitaxially grown from the surface of the fin-type active regions FA and FB included in an inner wall of the recess 124R. In some example embodiments, the source/drain region 124 may have a top surface, of which a vertical level is approximately equal to the vertical level LV3 of the uppermost surface FT of the fin-type active regions FA and FB. However, it is not limited thereto. The term "vertical level" used in this specification denotes a length in a direction perpendicular to the first surface 110M of the substrate 110, for example, the Z direction.

The inter-gate insulating layer 128 may be interposed between the plurality of gate structures GS. The plurality of source/drain regions 124 may be covered by the inter-gate insulating layer 128. The insulating liner may be interposed between the plurality of source/drain regions 124 and the inter-gate insulating layer 128. The inter-gate insulating layer 128 may include a silicon oxide layer.

An insulating thin layer 150 may extend on the substrate 110 in parallel to the first surface 110M of the substrate 110. The insulating thin layer 150 may cover the plurality of gate structures GS, the plurality of gate insulating capping layers 140, the plurality of first insulating spacers 120, the plurality of upper fin-isolation insulating portions US, and the inter-gate insulating layer 128. The insulating thin layer 150 may include a silicon oxide layer, a silicon nitride layer, a polysilicon layer, or a combination thereof. An interlayer insulating layer 160 may be formed on the insulating thin layer 150. The interlayer insulating layer 160 may include a silicon oxide layer, a silicon nitride layer, or a combination thereof.

A plurality of contact plugs 184 may penetrate the interlayer insulating layer 160, the insulating thin layer 150, and the inter-gate insulating layer 128 and may be connected to the plurality of source/drain regions 124. In some example embodiments, a plurality of conductive barrier layers 182 may cover a side surface and a bottom surface of the plurality of contact plugs 184. In some example embodiments, the plurality of conductive barrier layers 182 and the plurality of contact plugs 184 may extend into the plurality of source/drain regions 124.

The plurality of contact plugs 184 may include, for example, a metal material, such as W, Cu, Ti, Ta, Ru, Mn, or Co, a metal nitride, such as TiN, TaN, CoN, or WN, or a metal alloy, such as cobalt tungsten phosphide (CoWP), cobalt tungsten boron (CoWB), or cobalt tungsten boron phosphide (CoWBP). The plurality of conductive barrier layers 182 may include, for example, Ti, Ta, TiN, TaN, or a combination thereof.

In some example embodiments, a silicide layer may be between the conductive barrier layers 182 and the source/drain regions 124. The silicide layer may include, for example, tungsten silicide (WSi), titanium silicide (TiSi), cobalt silicide (CoSi), or nickel silicide (NiSi). In some example embodiments, the silicide layer may include metal silicide of a metal element included in the conductive barrier layer 182. For example, when the conductive barrier layer 182 includes Ti, TiN, or a combination thereof, the silicide layer may include TiSi.

Although not additionally illustrated, a plurality of gate contacts penetrating the interlayer insulating layer 160, the insulating thin layer 150, and the gate insulating capping layer 140 and connected to the plurality of gate lines GL may further be formed. In some example embodiments, a side surface and a bottom surface of the plurality of gate contacts may be covered by a plurality of conductive gate barrier layers. The conductive gate barrier layer and the gate contact may have substantially the same structure as the conductive barrier layer 182 and the contact plug 184, respectively. In some example embodiments, the conductive gate barrier layer and the gate contact may be simultaneously formed with the conductive barrier layer 182 and the contact plug 184, respectively. However, it is not limited thereto, and the conductive gate barrier layer and the gate contact may be separately formed from the conductive barrier layer 182 and the contact plug 184, respectively.

The integrated circuit device 100 according to inventive concepts may boost or degrade the characteristics of the MOS transistor included in the integrated circuit device 100, by using the fin-isolation insulating portions FS for obtaining insulating distances between wires and contacts. Thus, a high operational speed and an operational accuracy may be achieved without increasing an area of the integrated circuit device 100.

Figure 2B:
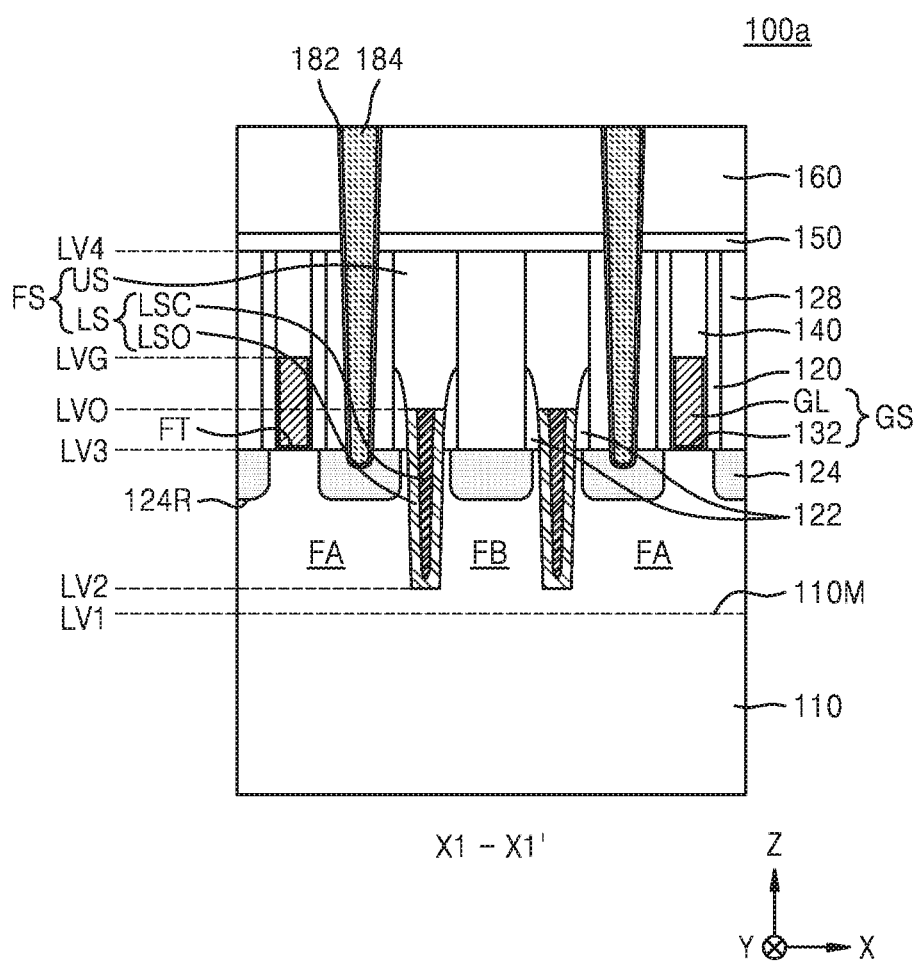
FIG. 2B is a cross-sectional view for describing an integrated circuit device according to some example embodiments.

FIG. 2B is a cross-sectional view for describing an integrated circuit device 100a according to some example embodiments. In detail, FIG. 2B is an example cross-sectional view taken along a line X1-X1' of FIG. 1. Like reference numerals in FIGS. 1 and 2A refer to like elements in FIG. 2B and their detailed descriptions will be omitted.

Referring to FIG. 2B, the integrated circuit device 100a may have substantially the same structure as the integrated circuit device 100 of FIG. 2A. However, in the integrated circuit device 100a, the plurality of conductive barrier layers 182 and the plurality of contact plugs 184 connected to the plurality of source/drain regions 124 filling the plurality of recesses 124R of the plurality of second fin-type regions FB may not be formed. The plurality of conductive barrier layers 182 and the plurality of contact plugs 184 may be formed to be connected to the plurality of source/drain regions 124 filling the plurality of recesses 124R of the plurality of first fin-type regions FA.

Thus, the plurality of conductive barrier layers 182 and the plurality of contact plugs 184 may be to vertically overlap the plurality of first fin-type regions FA and not to vertically overlap the plurality of second fin-type regions FB.

Figure 2C:
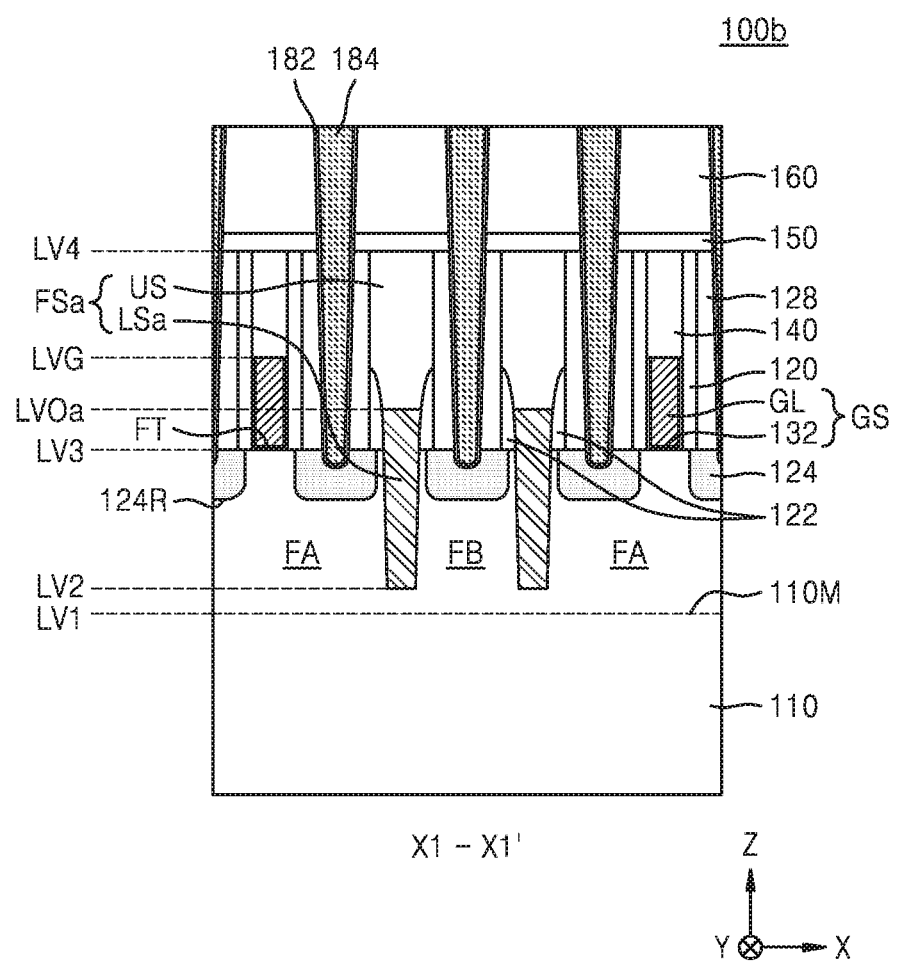
FIG. 2C is a cross-sectional view for describing an integrated circuit device according to some example embodiments.

FIG. 2C is a cross-sectional view for describing an integrated circuit device 100b according to some example embodiments. In detail, FIG. 2C is an example cross-sectional view taken along the line X1-X1' of FIG. 1. Like reference numerals in FIGS. 1 and 2A refer to like elements in FIG. 2C, and thus, their detailed descriptions will be omitted.

Referring to FIG. 2C, the integrated circuit device 100b may have substantially the same structure as the integrated circuit device 100 of FIG. 2A. However, the integrated circuit device 100b may include a plurality of fin-isolation insulating portions FSa, instead of the plurality of fin-isolation insulating portions FS.

The plurality of fin-isolation insulating portions FSa may include a lower fin-isolation insulating portion LSa and the upper fin-isolation insulating portion US located on the lower fin-isolation insulating portion LSa. The upper fin-isolation insulating portion US and the lower fin-isolation insulating portion LSa may be aligned in a vertical direction (the Z direction) with respect to each other. A bottom surface of the upper fin-isolation insulating portion US and a top surface of the lower fin-isolation insulating portion LSa may contact each other. The gate structure GS may not be located in an upward direction (the Z direction) of the lower fin-isolation insulating portion LSa, and the upper fin-isolation insulating portion US may be located in the upward direction (the Z direction) of the lower fin-isolation insulating portion LSa. The lower fin-isolation insulating portion LSa may be formed to have a single-layered structure including a single material, e.g. a homogenous material.

In some example embodiments, the lower fin-isolation insulating portion LSa may include a nitride layer, and the upper fin-isolation insulating portion US may include an oxide layer.

The lower fin-isolation insulating portion LSa may be located between the vertical level LV1 of the first surface 110M of the substrate 110 and the vertical level LVG of the uppermost surface of the gate structures GS. A vertical level LV2 of a lowermost surface of the lower fin-isolation insulating portion LSa may be higher than the vertical level LV1 of the first surface 110M of the substrate 110 and lower than the vertical level LV3 of the uppermost surface FT of the fin-type active regions FA and FB. Also, a vertical level LVOa of an uppermost surface of the lower fin-isolation insulating portion LSa may be higher than the vertical level LV3 of the uppermost surface FT of the fin-type active regions FA and FB and lower than the vertical level LVG of the uppermost surface of the gate structure GS.

The vertical level LVO of the lowermost surface of the upper fin-isolation insulating portion US may be higher than the vertical level LV3 of the uppermost surface FT of the fin-type active regions FA and FB and lower than the vertical level LVG of the uppermost surface of the gate structure GS. Also, a vertical level LV4 of an uppermost surface of the upper fin-isolation insulating portion US may be higher than the vertical level LVG of the uppermost surface of the gate structure GS.

Figure 2D:
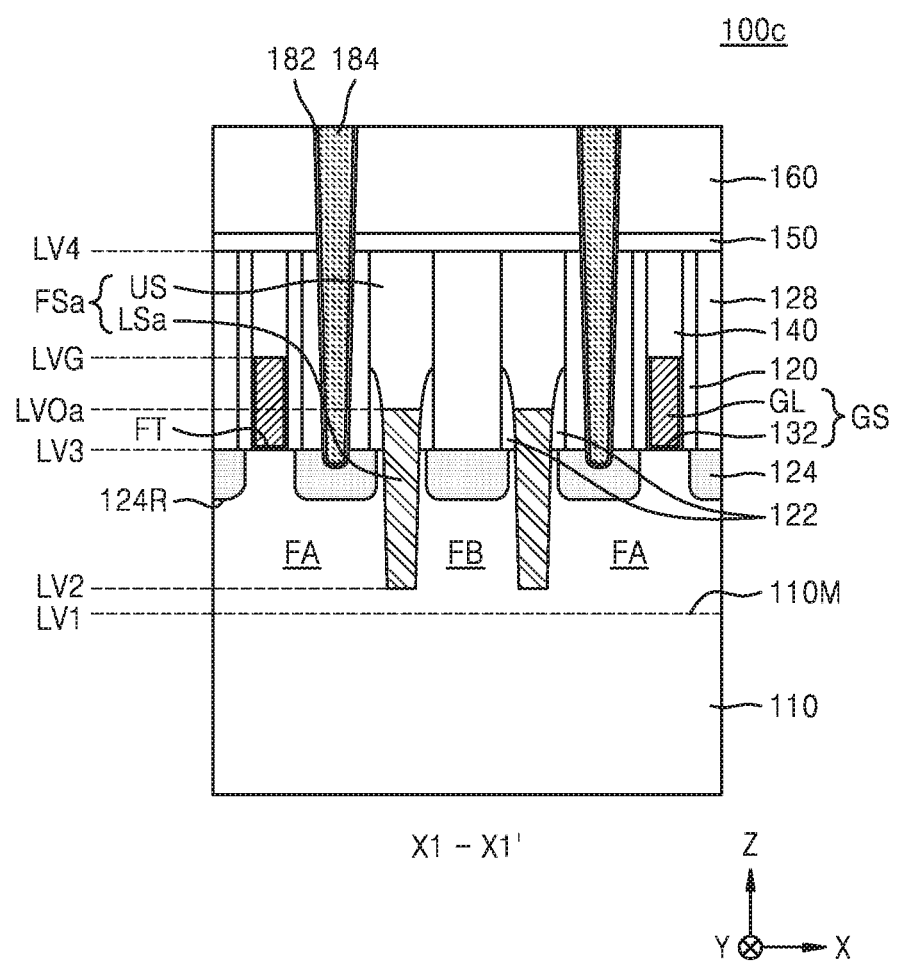
FIG. 2D is a cross-sectional view for describing an integrated circuit device according to some example embodiments.

FIG. 2D is a cross-sectional view for describing an integrated circuit device 100c according to some example embodiments. In detail, FIG. 2D is an example cross-sectional view taken along the line X1-X1' of FIG. 1. Like reference numerals in FIGS. 1 and 2C refer to like elements in FIG. 2D, and thus, their detailed descriptions will be omitted.

Referring to FIG. 2D, the integrated circuit device 100c may have substantially the same structure as the integrated circuit device 100b of FIG. 2C. However, in the integrated circuit device 100c, the plurality of conductive barrier layers 182 and the plurality of contact plugs 184 connected to the plurality of source/drain regions 124 filling the plurality of recesses 124R of the plurality of second fin-type regions FB may not be formed. For example, the plurality of conductive barrier layers 182 and the plurality of contact plugs 184 may be formed to be connected to the plurality of source/drain regions 124 filling the plurality of recesses 124R of the plurality of first fin-type regions FA.

FIGS. 3A and 3B through 16A, 16B, and 16C are cross-sectional views illustrated in a process order for describing a method of manufacturing an integrated circuit device, according to some example embodiments. In detail, FIGS. 3A, 4A, 5A, 6A, 7A, 8A, 9A, 10A, 11A, 12A, 13A, 14A, 15A, and 16A are cross-sectional views of a portion corresponding to the line X1-X1' of FIG. 1, FIGS. 3B, 4B, 5B, 6B, 7B, 8B, 9B, 10B, 11B, 12B, 13B, 14B, 15B, and 16B are cross-sectional views of a portion corresponding to a line Y1-Y1' of FIG. 1, and FIGS. 6C, 7C, 8C, 9C, 10C, 11C, 12C, 13C, 14C, 15C, and 16C are cross-sectional views of a portion corresponding to a line Y2-Y2' of FIG. 1.

Figure 3A:
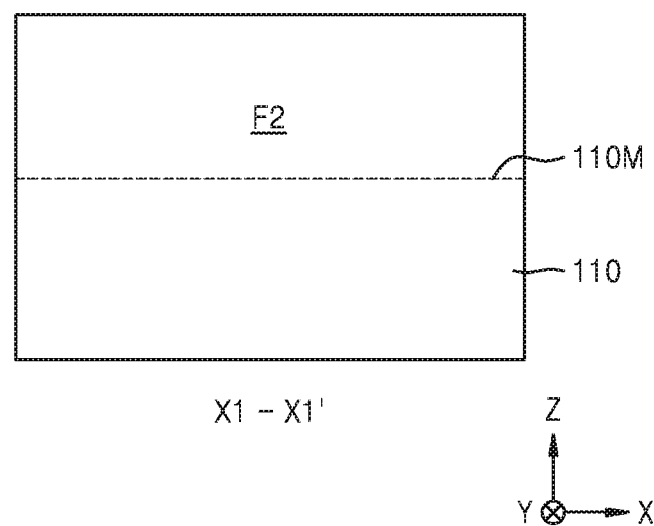
Figure 3B:
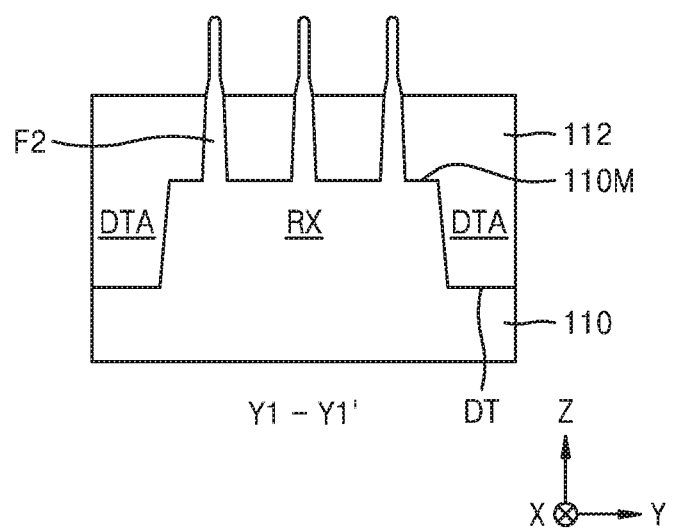

Referring to FIGS. 3A and 3B together, the plurality of preliminary fin-type active regions F2 protruding from the first surface 110M of the substrate 110 toward an upward direction (the Z direction) and extending in the first direction (the X direction) may be formed by etching a portion of the substrate 110, and the element-isolation layer 112 covering both lower side walls of each of the plurality of preliminary fin-type active regions F2 may be formed. The plurality of preliminary fin-type active regions F2 may protrude above a top surface of the element-isolation layer 12 in the element region RX.

The deep trench DT defining the element region RX may be formed by etching a portion of the element-isolation layer 112 and a portion of the substrate 110, and the element-isolation region DTA may be formed by filling the deep trench DT with an insulating layer. In some example embodiments, after the plurality of preliminary fin-type active regions F2 and the deep trench DT are formed, the element-isolation layer 112 and the element-isolation region DTA may be formed together.

With respect to FIGS. 3A and 3B, the section corresponding to the line Y2-Y2' of FIG. 1 may be substantially the same as FIG. 3B, and thus, the section will not be illustrated.

Figure 4A:
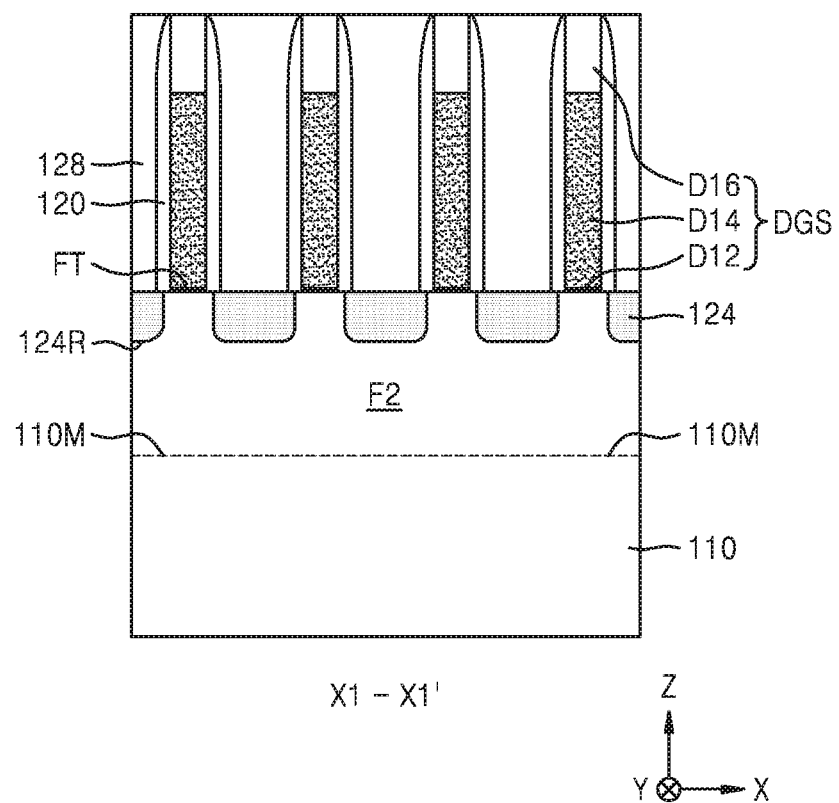
Figure 4B:
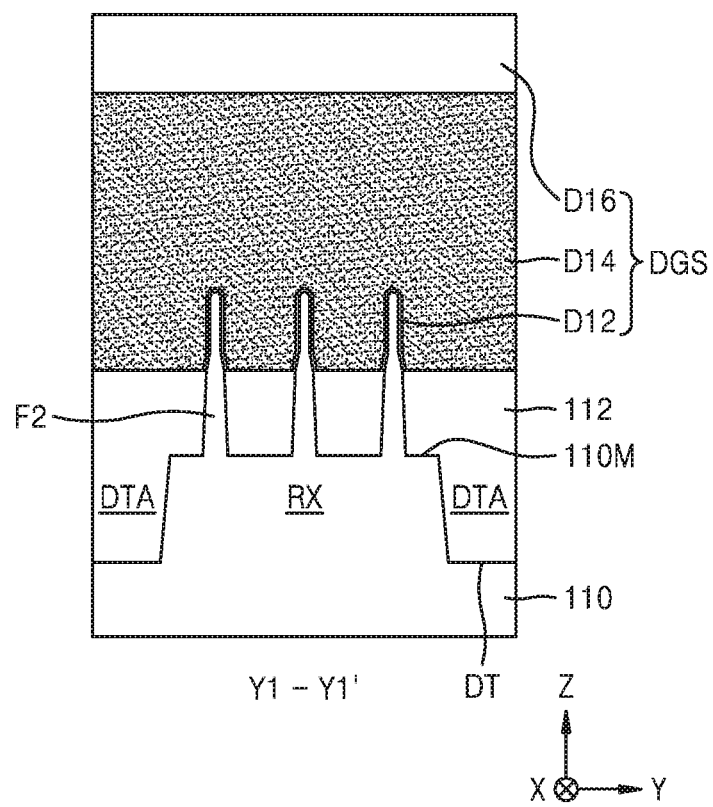

Referring to FIGS. 4A and 4B, the plurality of dummy gate structures DGS extending to cross the plurality of preliminary fin-type active regions F2 may be formed on the plurality of preliminary fin-type active regions F2. Each of the plurality of dummy gate structures DGS may include a dummy gate insulating layer D12, a dummy gate line D14, and a dummy gate insulating capping layer D16 sequentially stacked on the preliminary fin-type active regions F2. The dummy gate insulating layer D12 may include silicon oxide. The dummy gate line D14 may include polysilicon. The dummy gate insulating capping layer D16 may include silicon nitride.

The first insulating spacer 120 may be formed at both side walls of the dummy gate structure DGS. The first insulating spacer 120 may be formed by using an ALD process or a CVD process.

The plurality of recesses 124R may be formed at both sides of the dummy gate structures DGS by etching portions of the preliminary fin-type active regions F2, and the plurality of source/drain regions 124 may be formed by forming semiconductor layers by performing an epitaxial growth process in the plurality of recesses 124R.

The inter-gate insulating layer 128 filling a space defined by the plurality of source/drain regions 124, the plurality of dummy gate structures DGS, and the first insulating spacers 120 may be formed. In order to form the inter-gate insulating layer 128, an insulating layer covering a structure including the plurality of dummy gate structures DGS and the plurality of source/drain regions 124 by a sufficient thickness may be formed, and then, the insulating layer may be planarized to expose a top surface of the dummy gate insulating capping layer D16.

In some example embodiments, an insulating liner conformally covering the plurality of source/drain regions 124, the plurality of dummy gate structures DGS, and the first insulating spacers 120 may be formed first, and then, the inter-gate insulating layer 128 may be formed on the insulating liner.

With respect to FIGS. 4A and 4B, the section corresponding to the line Y2-Y2' of FIG. 1 may be substantially the same as FIG. 4B, and thus, the section will not be illustrated.

Figure 5A:
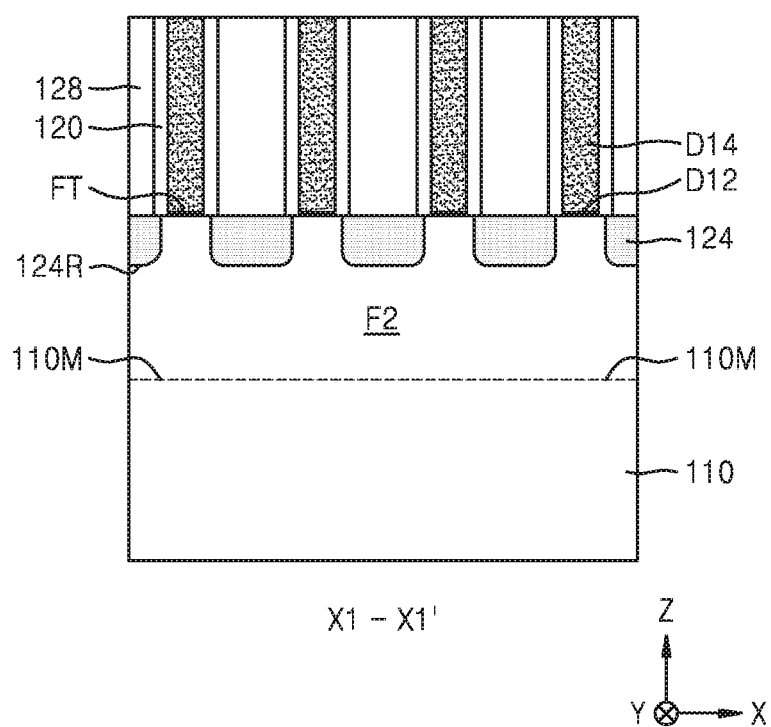
Figure 5B:
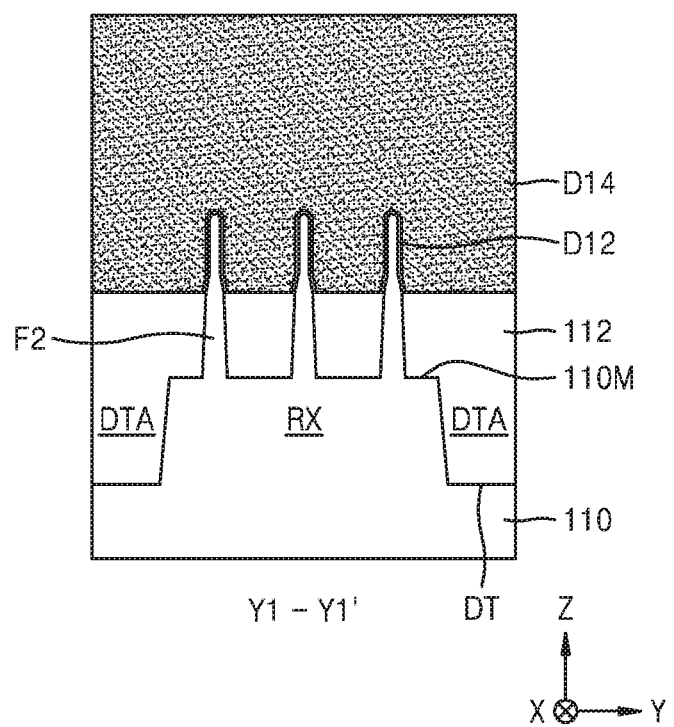

Referring to FIGS. 5A and 5B together, a planarization process may be performed, whereby a portion of the first insulating spacer 120, a portion of the inter-gate insulating layer 128, and the dummy gate insulating capping layer (D16 of FIGS. 4A and 4B) are removed, in order to expose a top surface of the dummy gate line D14. In some example embodiments, the process illustrated in FIGS. 4A and 4B and the process illustrated in FIGS. 5A and 5B may be sequentially performed by an in-situ process.

With respect to FIGS. 5A and 5B, the section corresponding to the line Y2-Y2' of FIG. 1 may be substantially the same as FIG. 5B, and thus, the section will not be illustrated.

Figure 6A:
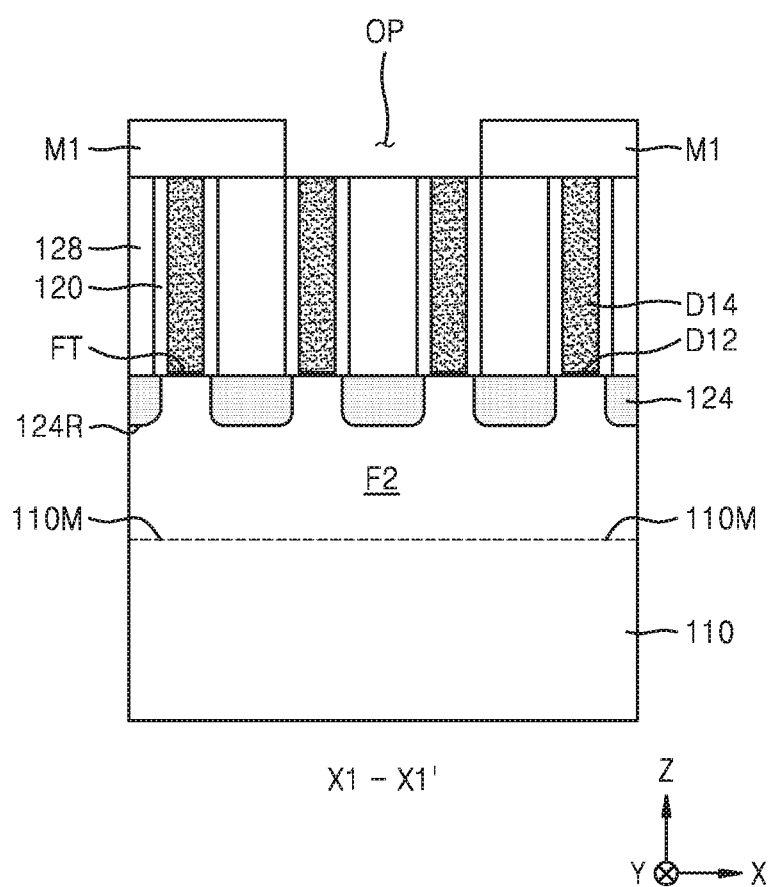
Figure 6B:
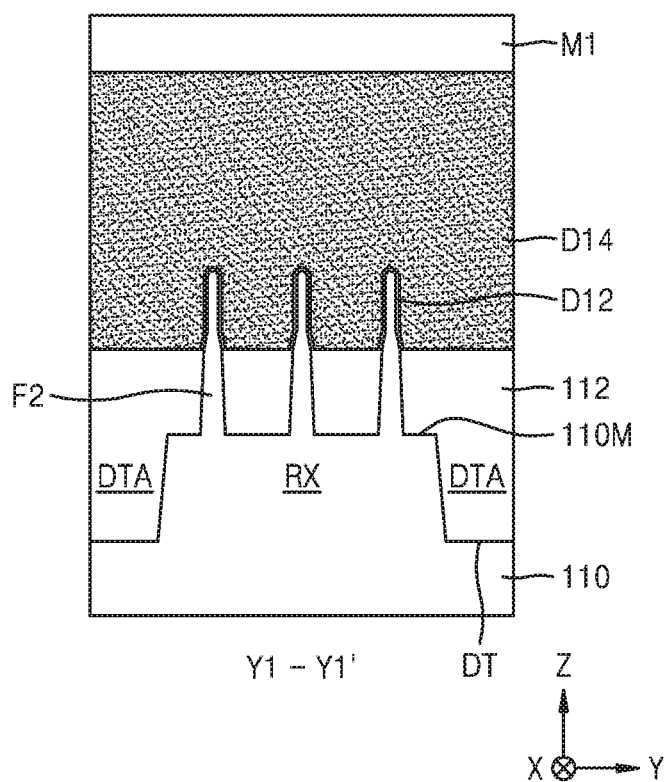
Figure 6C:
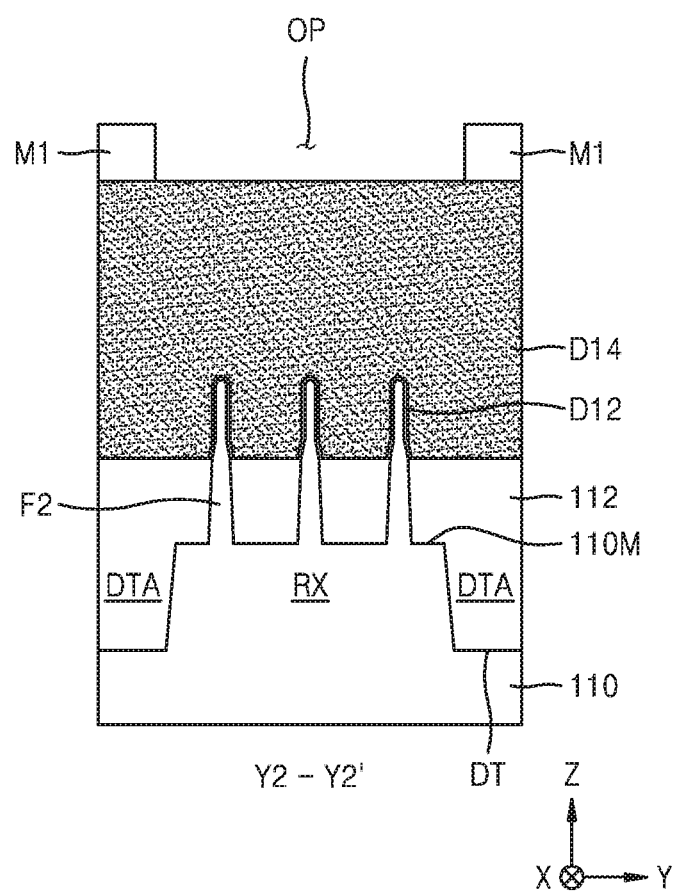

Referring to FIGS. 6A through 6C together, a mask pattern M1 may be formed on an object resulting from the method described with reference to FIGS. 5A and 5B. The mask pattern M1 may have an opening OP exposing a portion of the dummy gate line D14. A planar shape of the opening OP may include two adjacent fin-isolation insulating portions FS illustrated in FIG. 1 and may correspond to a planar shape not including the plurality of gate structures GS. The mask pattern M1 may have a multi-layered structure of a stack of a plurality of hard mask layers. In some example embodiments, the mask pattern M1 may include a silicon nitride layer, a silicon oxide layer, a polysilicon layer, a carbon-containing layer, or a combination thereof. The carbon-containing layer may include a spin-on hardmask (SOH) material. The SOH material may include a hydrocarbon compound or derivatives thereof, the hydrocarbon having a relatively high carbon content of about 85 weight % to about 99 weight % based on the total weight of the SOH material.

In some example embodiments, a portion of each of two dummy gate lines D14 may be exposed by the opening OP.

Figure 7A:
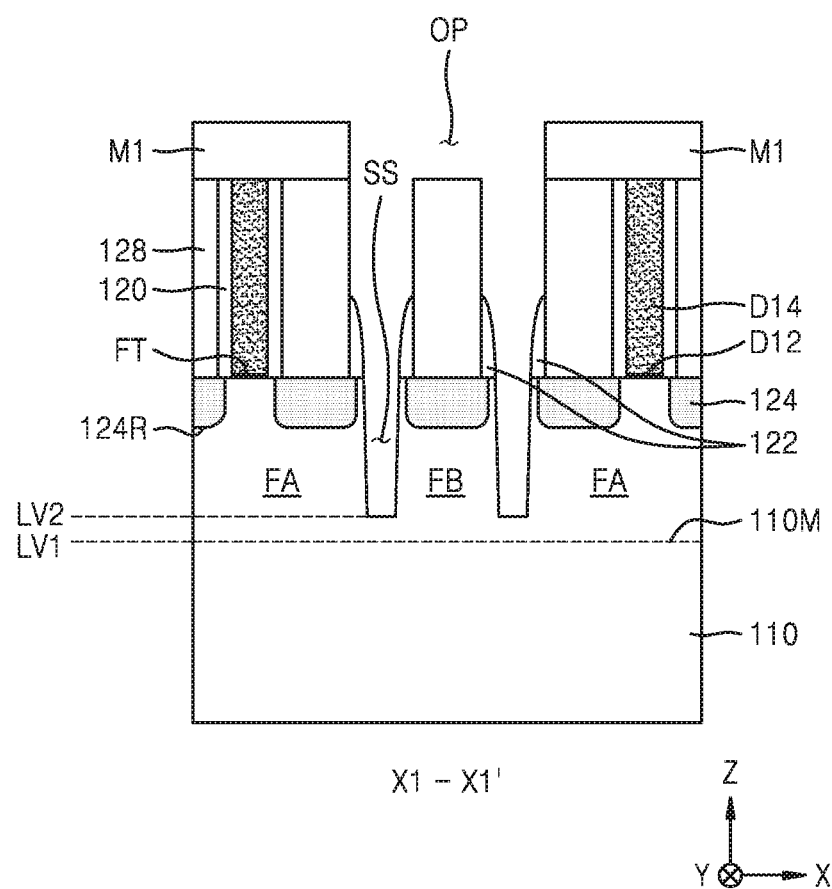
Figure 7B:
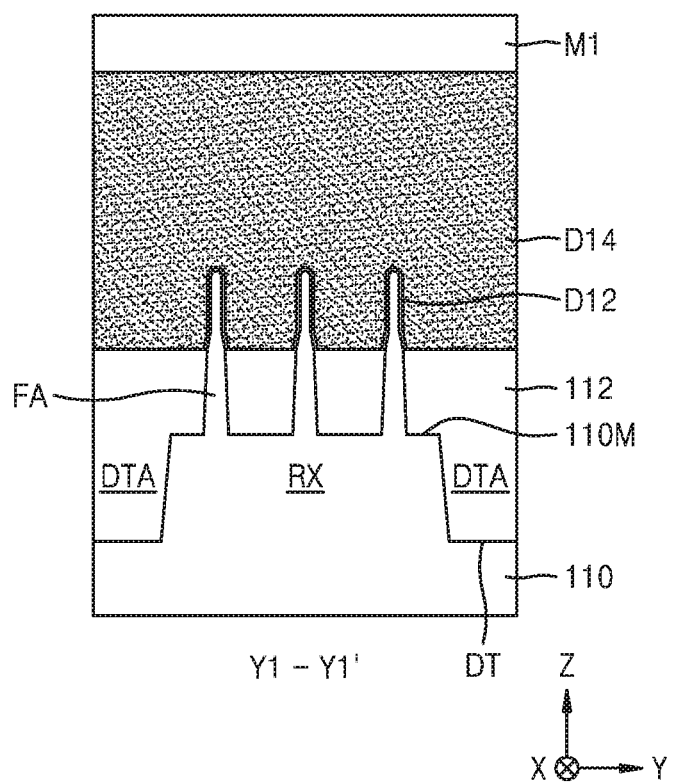
Figure 7C:
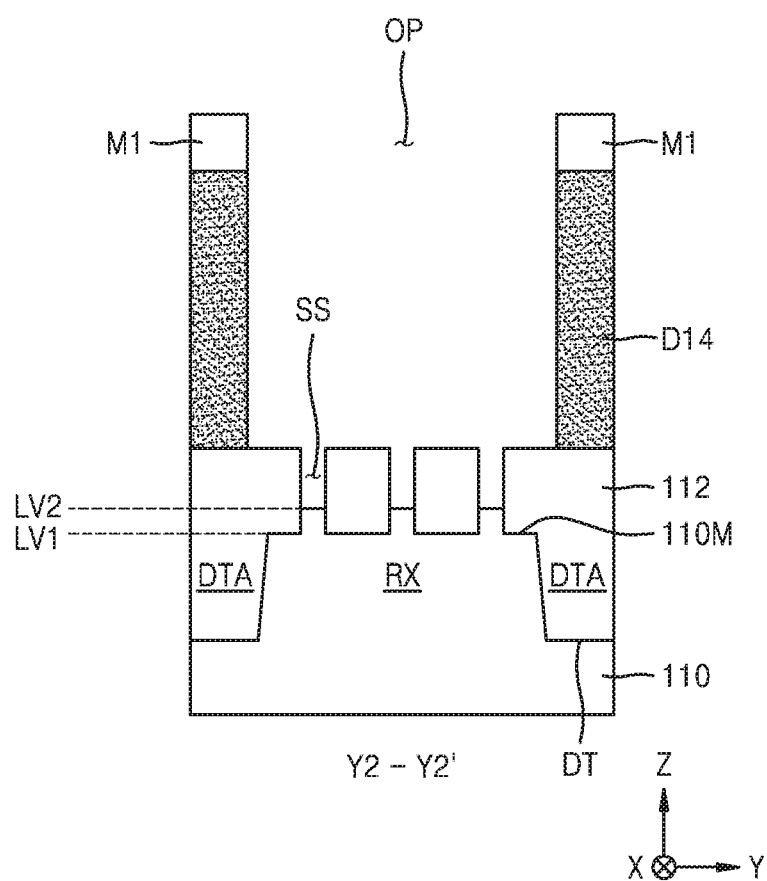

Referring to FIGS. 7A through 7C together, a portion of the dummy gate line D14 exposed by the opening OP may be etched and removed by using the mask pattern M1, formed by the method described with reference to FIGS. 6A through 6C, as an etch mask, and the dummy gate insulating layer D12 exposed as a result thereof may be removed. Then, the plurality of preliminary fin-type active regions F2 exposed by the opening OP after the dummy gate insulating layer D12 is removed, may be etched to form a plurality of fin-isolation spaces SS. The fin-isolation spaces SS may have a bottom surface having the vertical level LV2, which is higher than the vertical level LV1 of the first surface 110M of the substrate 110.

The preliminary fin-type active regions F2 may be divided into the first fin-type region FA and the second fin-type region FB by the fin-isolation spaces SS formed by removing a portion of the preliminary fin-type active regions F2.

While the dummy gate line D14, the dummy gate insulating layer D12, and the preliminary fin-type active regions F2 are etched to form the fin-isolation spaces SS, a portion of the first insulating spacer 120 exposed to etching together by the opening OP may be removed. Accordingly, the plurality of second insulating spacers 122, which are lower than the first insulating spacers 120, may be formed.

Figure 8A:
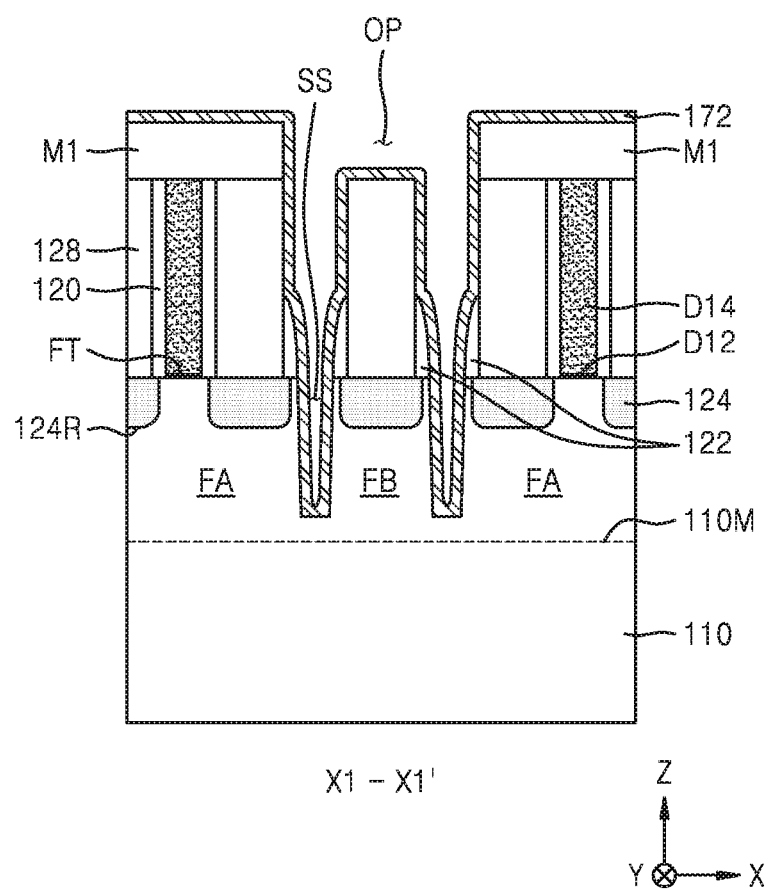
Figure 8B:
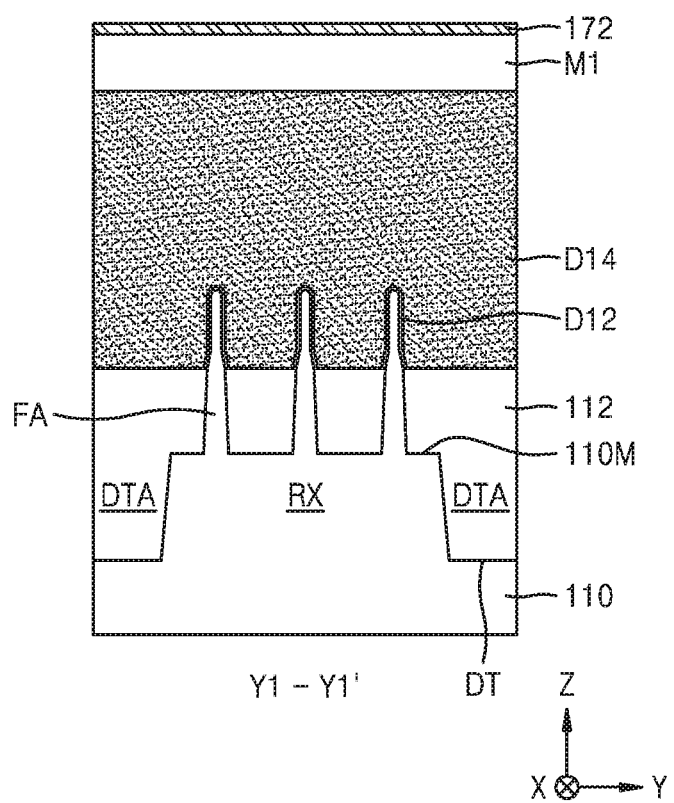
Figure 8C:
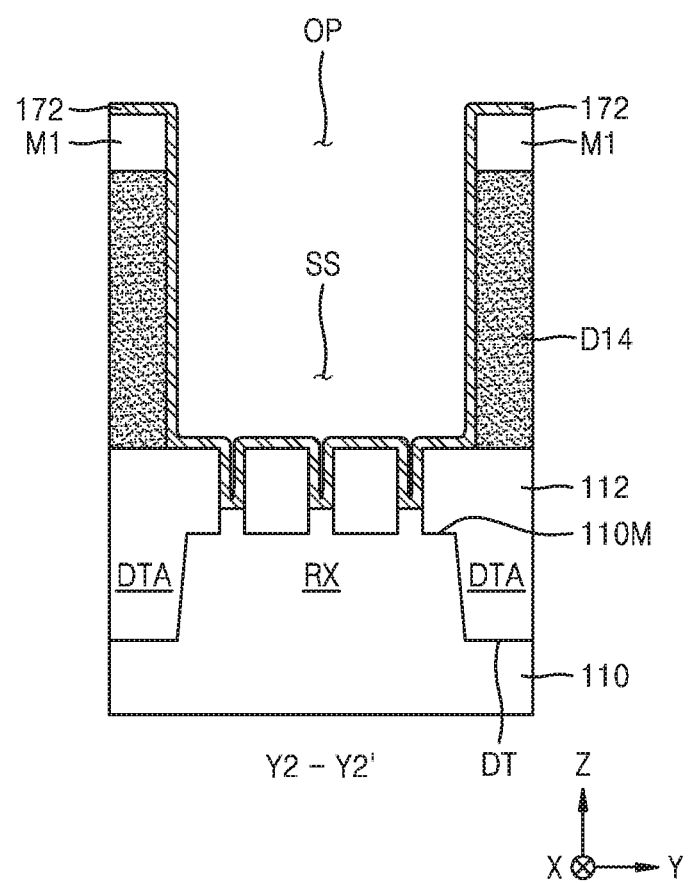

Referring to FIGS. 8A through 8C together, a first lower fin-isolation insulating layer 172 conformally covering an inner surface of the fin-isolation spaces SS may be formed. The first lower fin-isolation insulating layer 172 may also cover a top surface and a side surface of the mask pattern M1. The first lower fin-isolation insulating layer 172 may include, for example, a nitride layer. The first lower fin-isolation insulating layer 172 may be formed by using an ALD process.

Figure 9A:
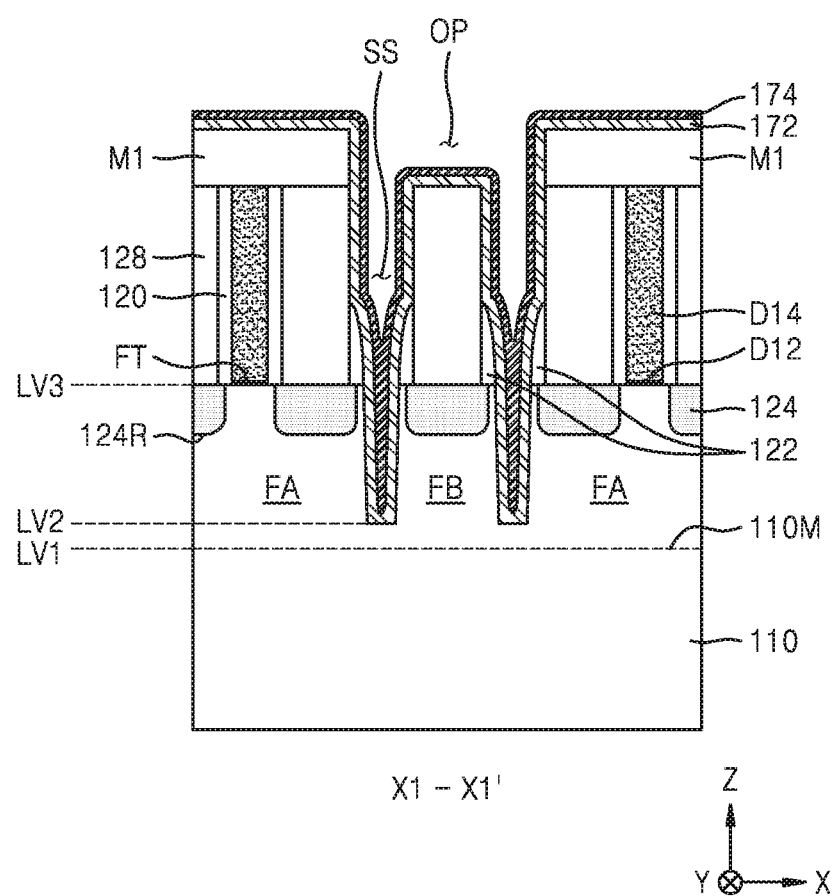
Figure 9B:
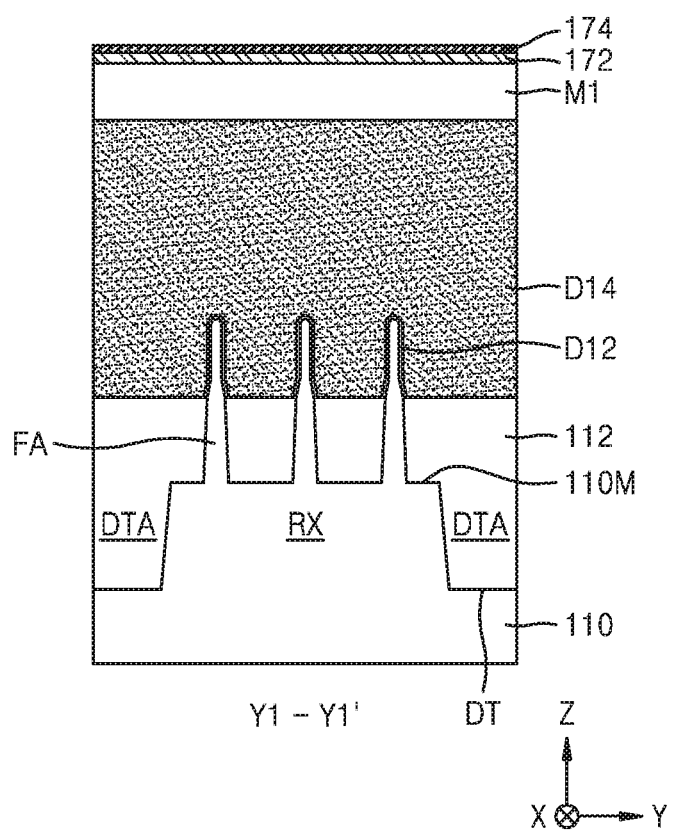
Figure 9C:
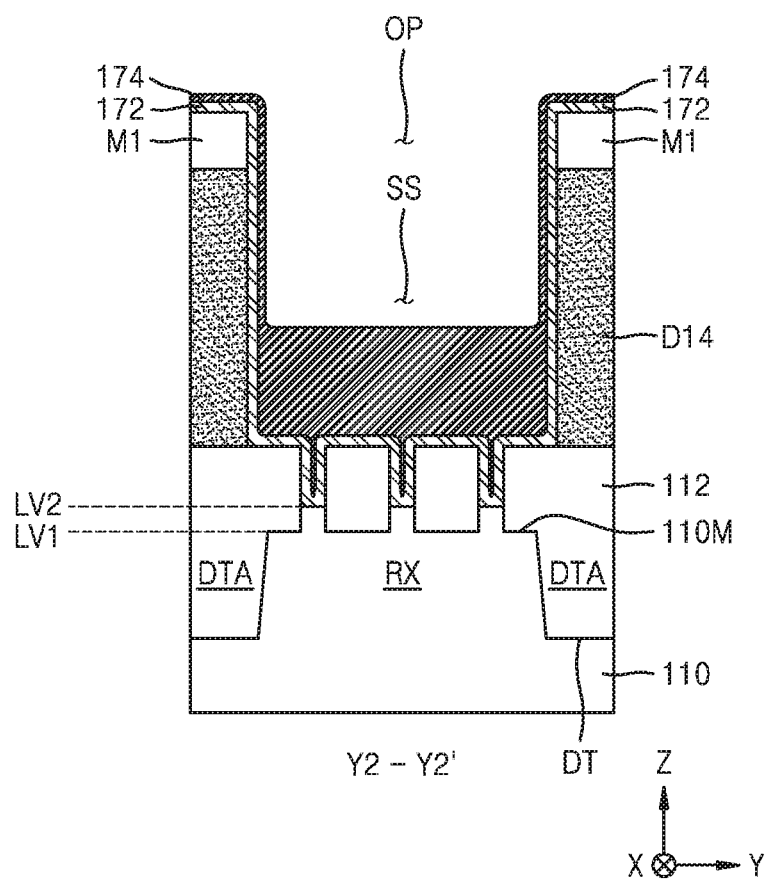

Referring to FIGS. 9A through 9C together, a second lower fin-isolation insulating layer 174 covering the first lower fin-isolation insulating layer 172 may be formed. The second lower fin-isolation insulating layer 174 may include, for example, an oxide layer. The second lower fin-isolation insulating layer 174 may be formed by using an ALD process or a CVD process. The second lower fin-isolation insulating layer 174 may be formed to fill a lower portion of the fin-isolation spaces SS. The first lower fin-isolation insulating layer 172 and the second lower fin-isolation insulating layer 174 may fill from a bottom surface of the fin-isolation spaces SS to a level at least higher than the vertical level LV3 of the uppermost surface FT of the fin-type active regions FA and FB.

Figure 10A:
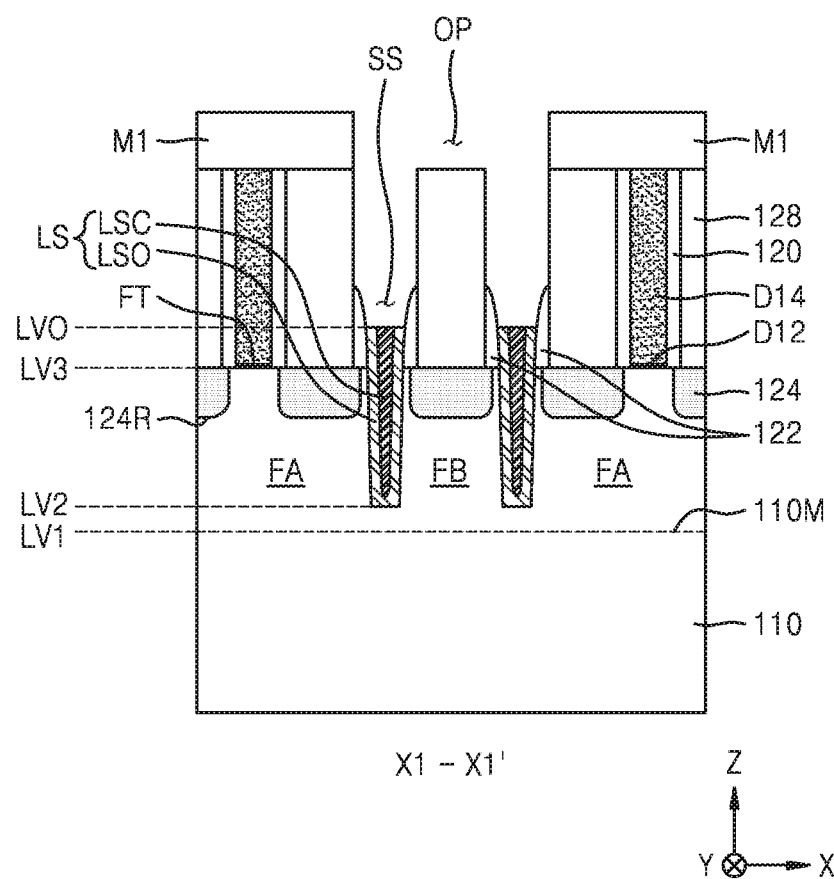
Figure 10B:
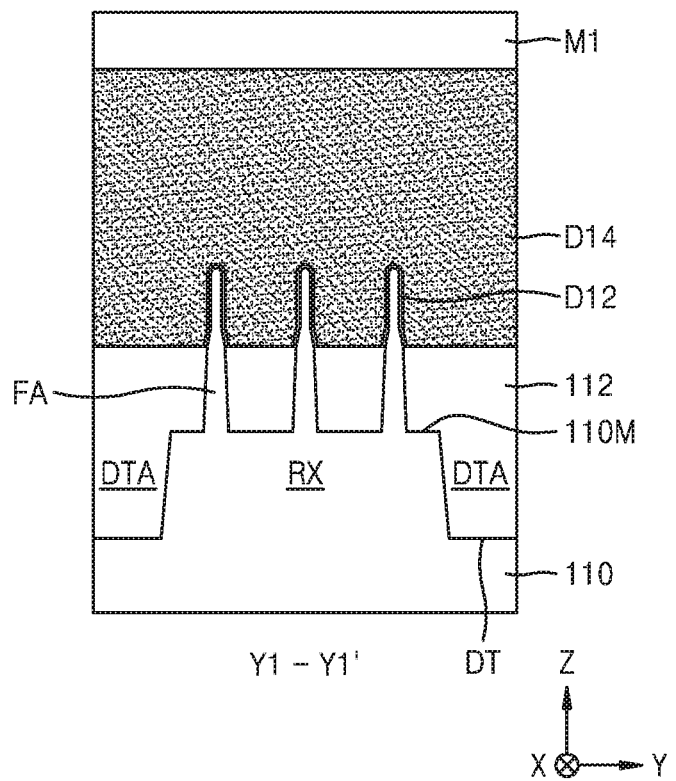
Figure 10C:
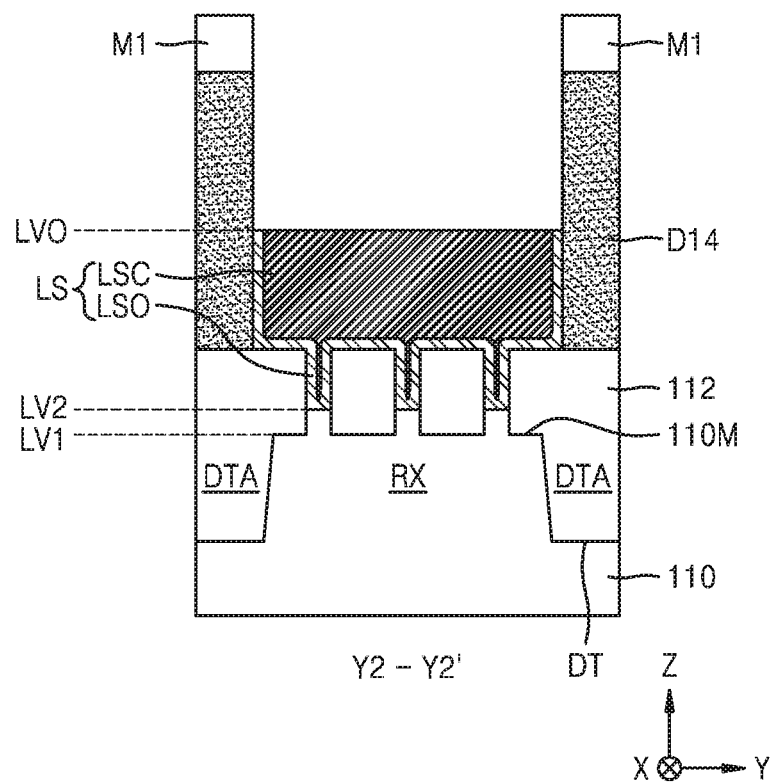

Referring to FIGS. 10A through 10C together, upper portions of the second lower fin-isolation insulating layer 174 and the first lower fin-isolation insulating layer 172 may be removed from an object resulting from the method described with reference to FIGS. 9A through 9C, to form the lower fin-isolation insulating portion LS. In order to form the lower fin-isolation insulating portion LS, the upper portions of the second lower fin-isolation insulating layer 174 and the first lower fin-isolation insulating layer 172 may be removed by using a wet etching process and a dry etching process.

The lower fin-isolation insulating portion LS may include the core insulating pattern LSC and the peripheral insulating pattern LSO covering side surfaces and a bottom surface of the core insulating pattern LSC. The core insulating pattern LSC and the peripheral insulating pattern LSO may be a portion of the second lower fin-isolation insulating layer 174 and a portion of the first lower fin-isolation insulating layer 172, respectively.

The vertical level LV0 of the uppermost surface of the lower fin-isolation insulating portion LS may be higher than the vertical level LV3 of the uppermost surface FT of the fin-type active regions FA and FB and may be lower than a vertical level of an uppermost surface of the dummy gate line D14.

Figure 11A:
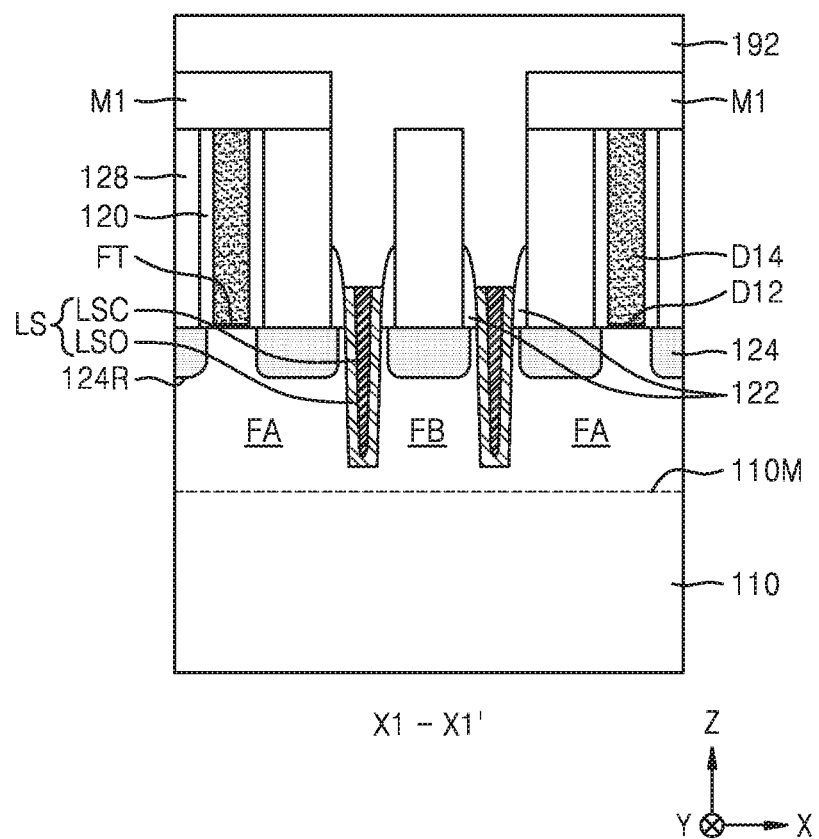
Figure 11B:
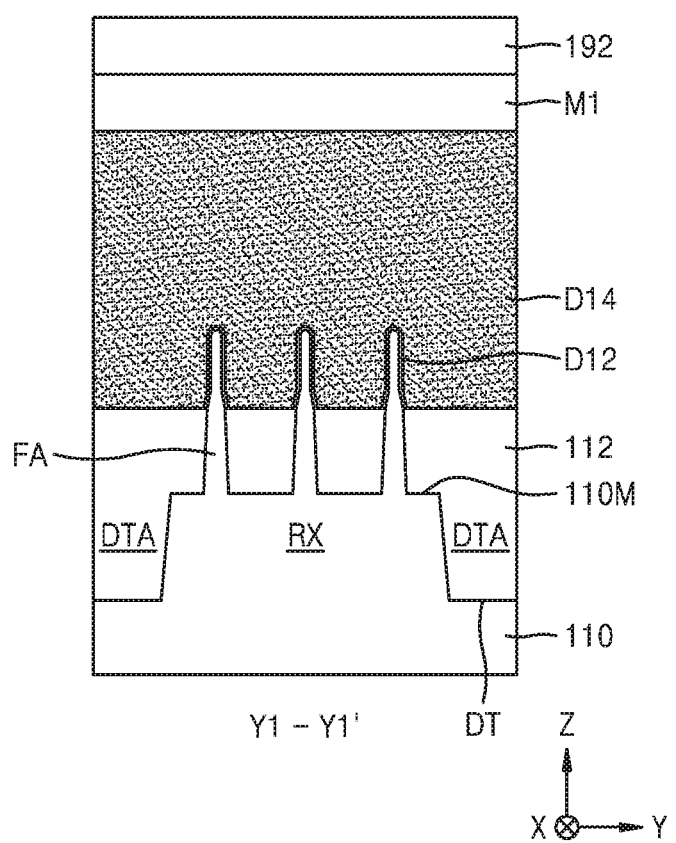
Figure 11C:
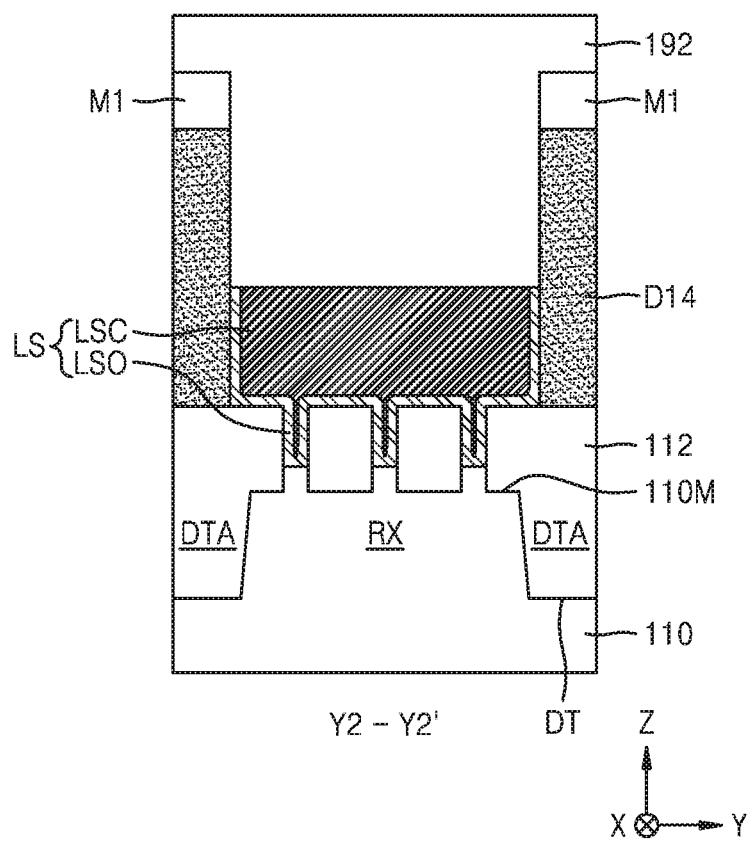

Referring to FIGS. 11A through 11C together, a gap-fill insulating layer 192 filling all of the fin-isolation spaces SS may be formed on an object resulting from the method described with reference to FIGS. 10A through 10C. The gap-fill insulating layer 192 may fill all of the fin-isolation spaces SS and may be formed to cover both the top surface and the side surface of the mask pattern M1.

Figure 12A:
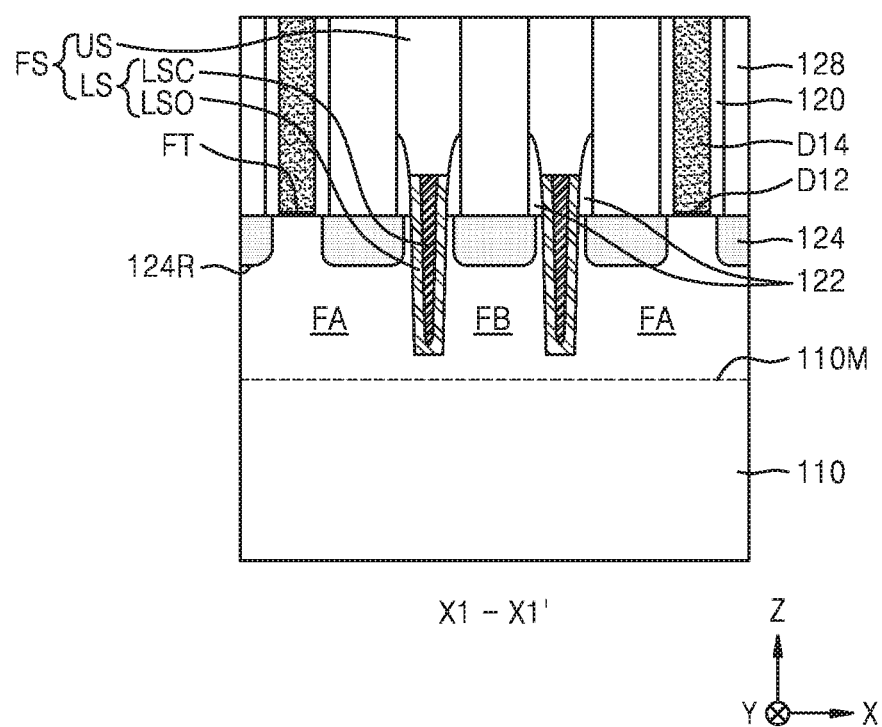
Figure 12B:
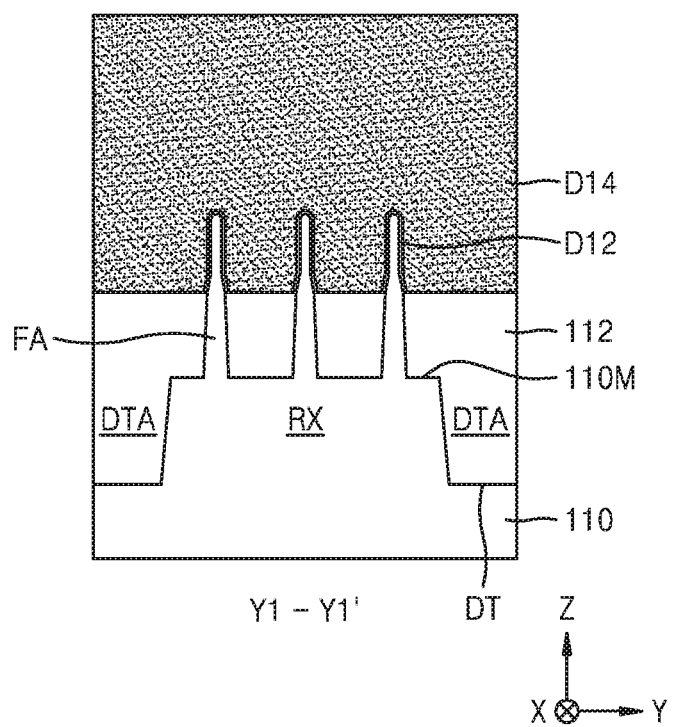
Figure 12C:
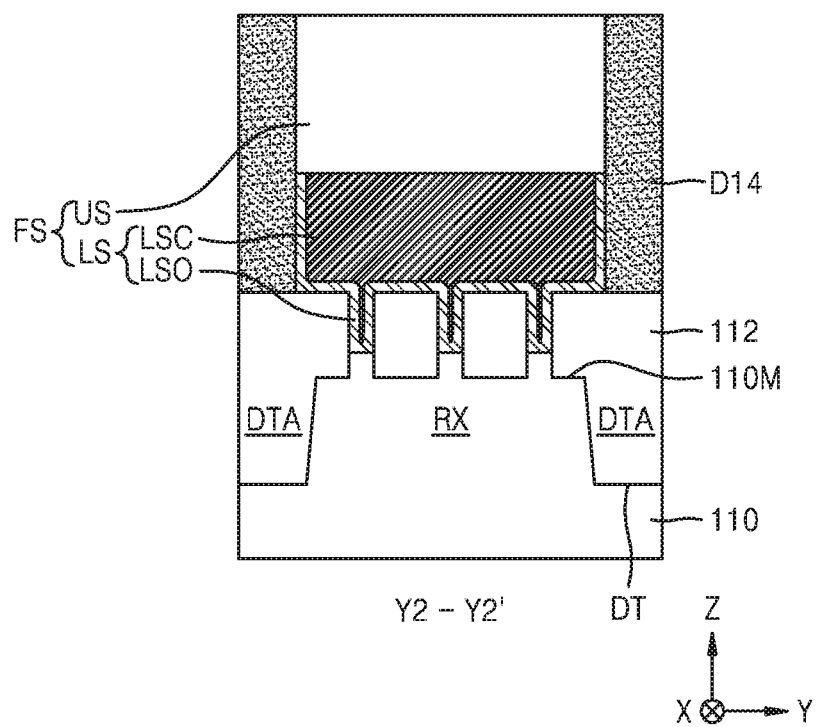

Referring to FIGS. 12A through 12C together, the gap-fill insulating layer 192 formed by the method described with reference to FIGS. 11A through 11C may be planarized to expose the top surface of the dummy gate line D14, in order to form the upper fin-isolation insulating portion US, which is a portion of the gap-fill insulating layer 192. The upper fin-isolation insulating portion US and the lower insulating pattern LS may be included in the fin-isolation insulating portion FS.

Figure 13A:
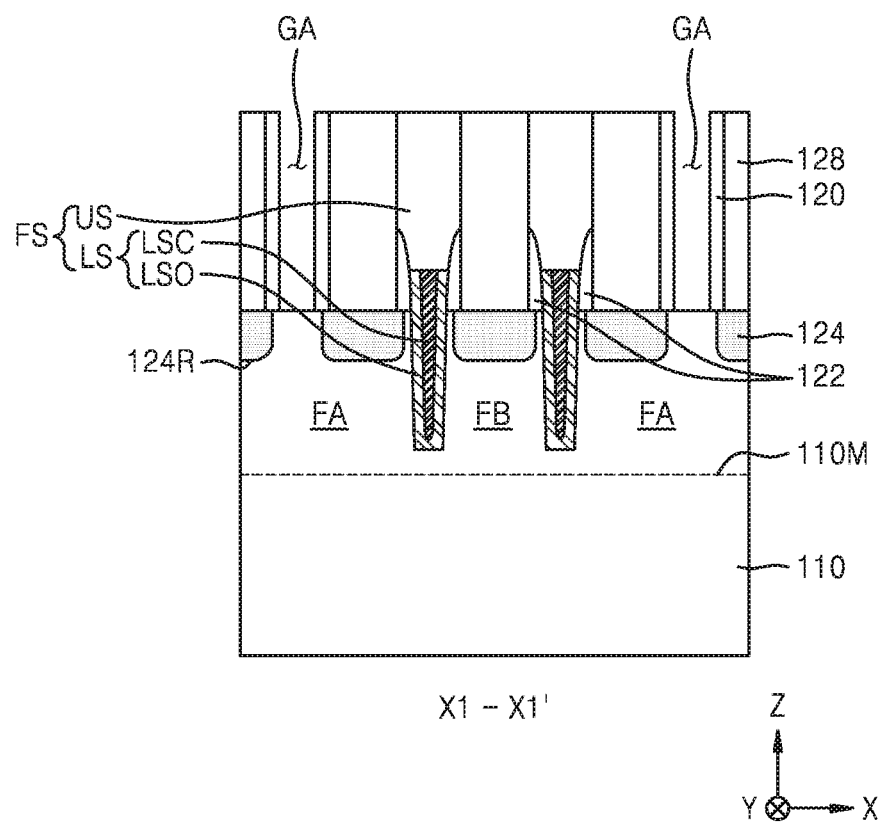
Figure 13B:
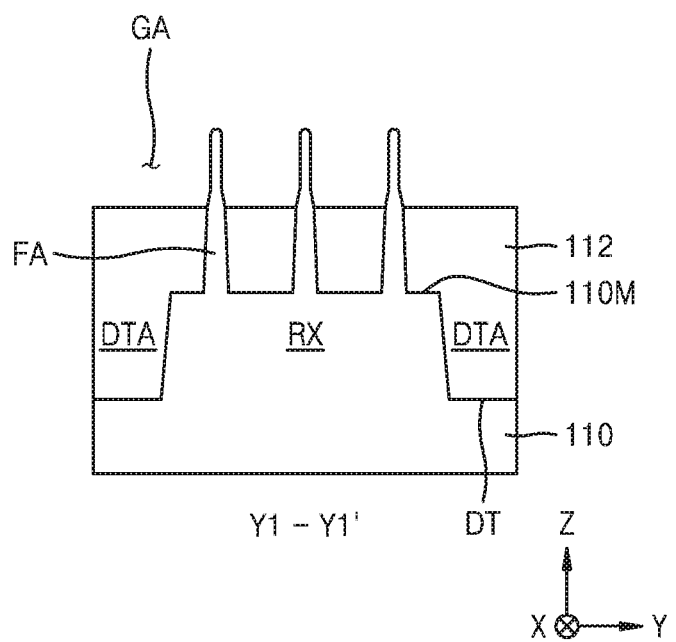
Figure 13C:
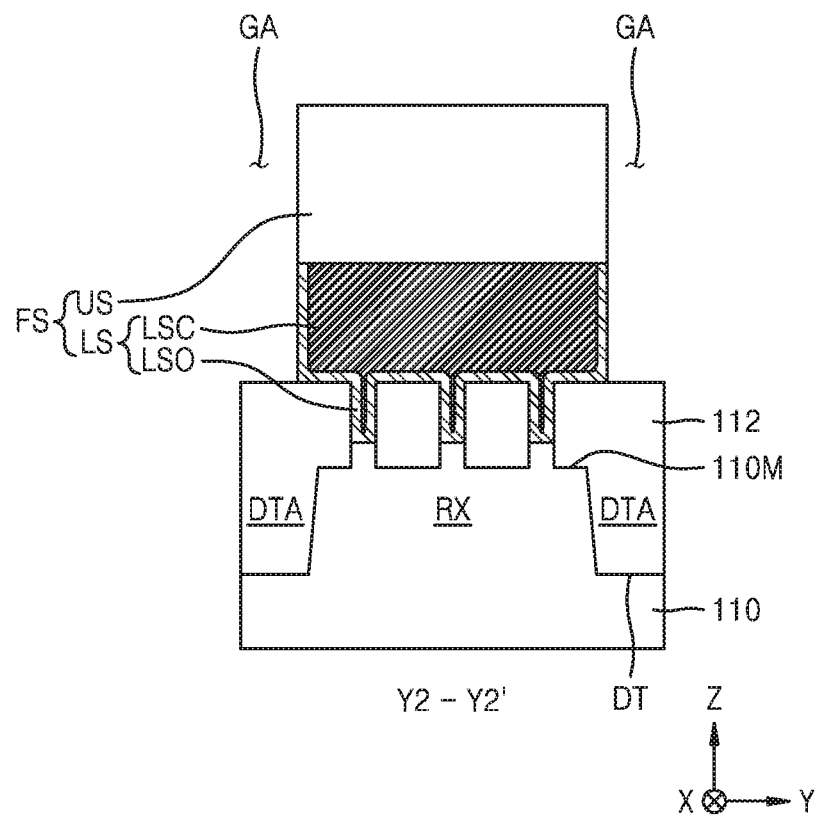

Referring to FIGS. 13A through 13C together, the dummy gate line D14 and the dummy gate insulating layer D12 may be removed from an object resulting from the method described with reference to FIGS. 12A through 12C, in order to form a plurality of gate structure spaces GA. The first insulating spacers 120, the fin-type active regions FA and FB, and the element-isolation layer 112 may be exposed by the gate structure spaces GA.

Figure 14A:
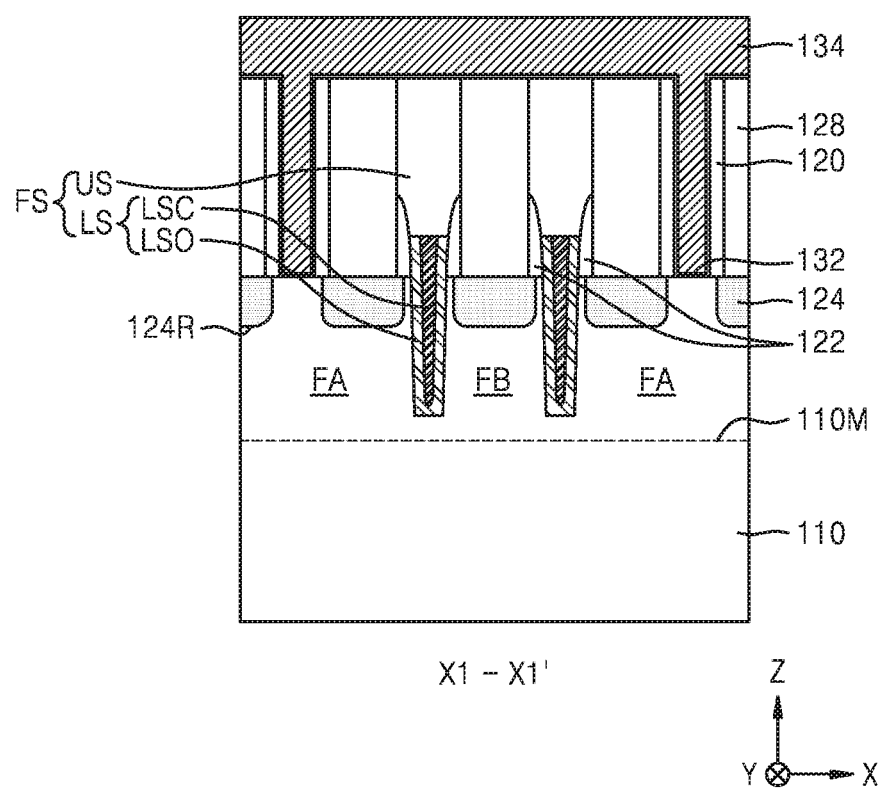
Figure 14B:
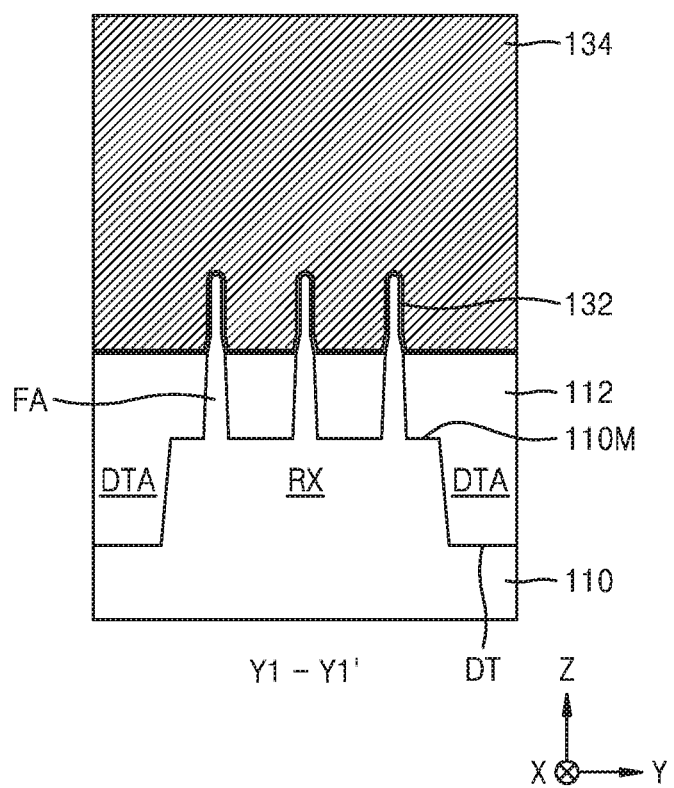
Figure 14C:
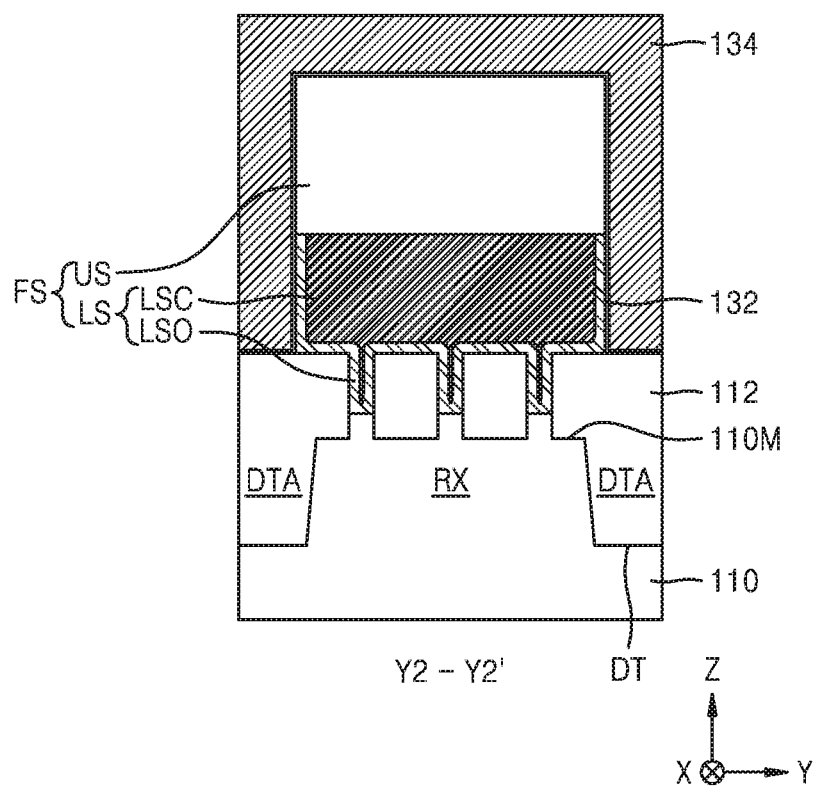

Referring to FIGS. 14A through 14C together, the gate insulating layer 132 and the gate conductive layer 134 may be formed in the plurality of gate structure spaces GA (refer to FIGS. 13A through 13C). Before forming the gate insulating layer 132, an interface layer may further be formed on a surface of the fin-type active regions FA and FB, the surface being exposed by the plurality of gate structure spaces GA. The interface layer may be obtained by oxidizing a portion of the fin-type active regions FA and FB, the portion being exposed in the plurality of gate structure spaces GA.

The gate insulating layer 132 and the gate conductive layer 134 may be formed to fill the inner space of the gate structure spaces GA and to cover a top surface of the inter-gate insulating layer 128. Each of the gate insulating layer 132 and the gate conductive layer 134 may be formed by an ALD process, a CVD process, a physical vapor deposition (PVD) process, a metal organic ALD (MOALD) process, or a metal organic CVD (MOCVD) process.

Figure 15A:
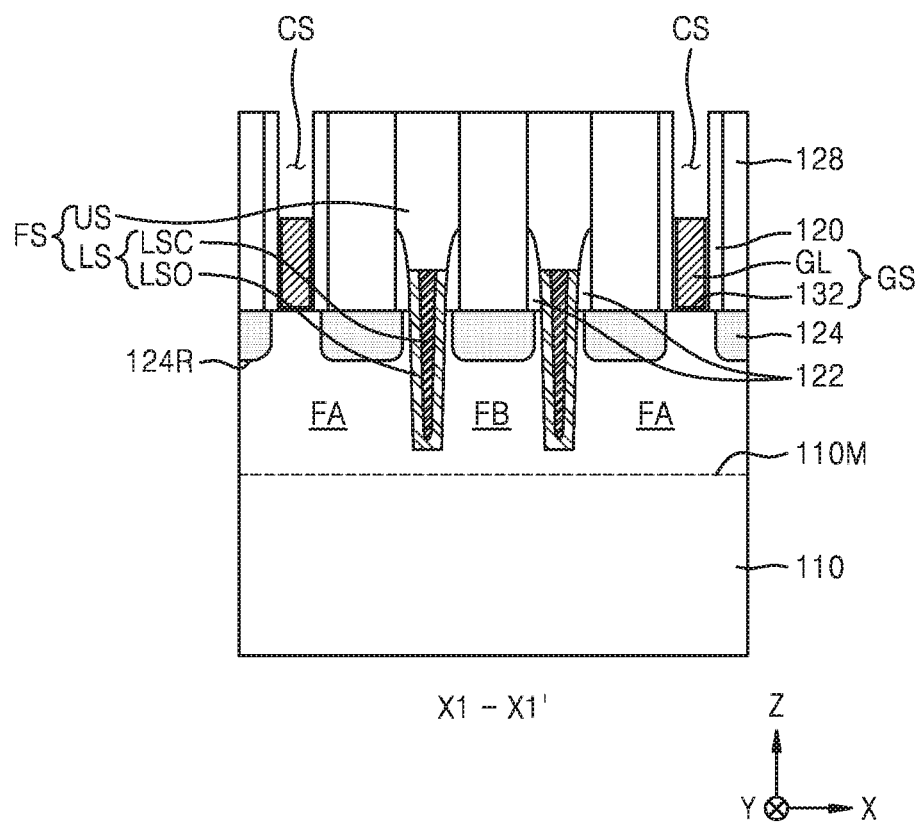
Figure 15B:
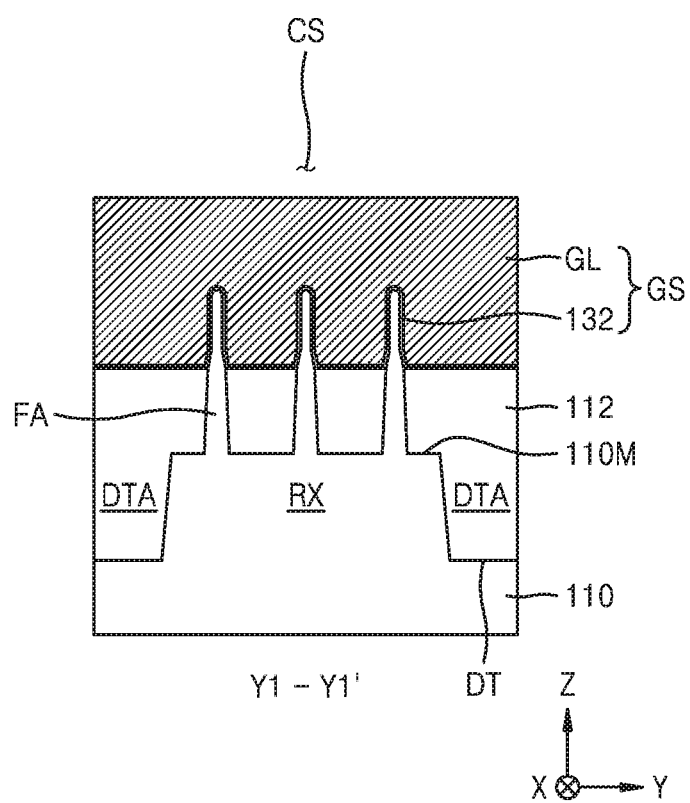
Figure 15C:
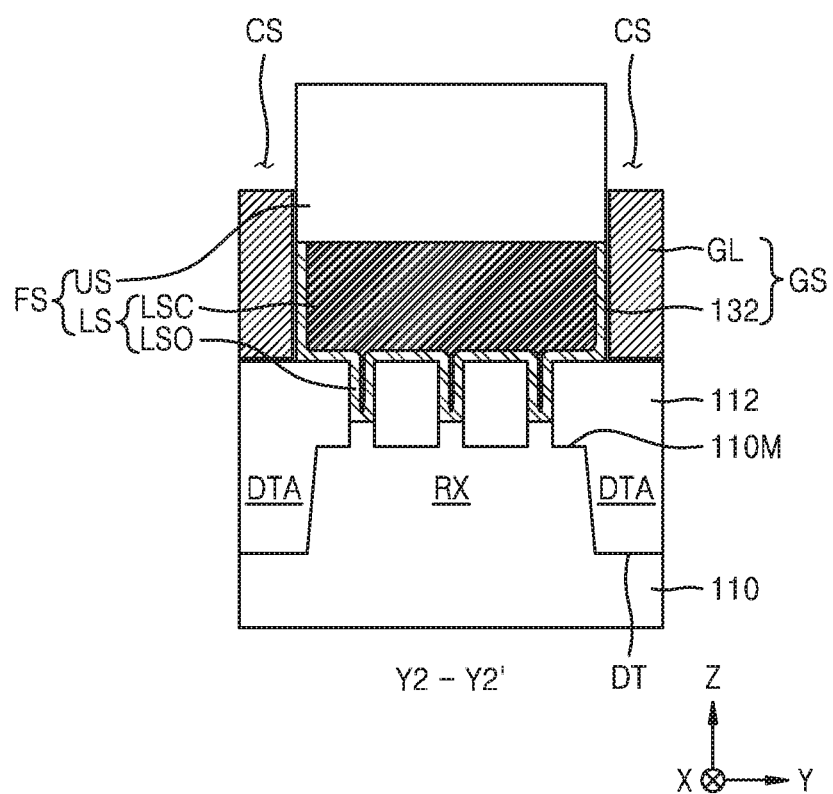

Referring to FIGS. 15A through 15C together, unnecessary portions of the gate insulating layer 132 and the gate conductive layer 134 (refer to FIGS. 14A through 14C) may be removed to expose the top surface of the inter-gate insulating layer 128, and upper portions of the gate insulating layer 132 and the gate conductive layer 134 may further be removed, to form a capping space CS. A portion of the gate conductive layer 134, which remains in the gate structure space GA (refer to FIGS. 13A through 13C), may form the gate line GL.

To remove the portion of the gate conductive layer 134, an etch selectivity between a metal layer and/or a metal containing layer included in the gate conductive layer 134, and a silicon oxide layer included in the inter-gate insulating layer 128 may be used. For example, an etch gas containing $BCl_3$ may be used, and a content of $BCl_3$ in the etch gas containing $BCl_3$ may be controlled, to suppress etching of the silicon oxide layer and relatively increase an etch speed of the metal layer and/or the metal containing layer. The etch gas containing $BCl_3$ may include $BCl_3$, or a combination of $BCl_3$ and $SiCl_4$. While the gate conductive layer 134 is removed by etching, the gate insulating layer 132 having a relatively less thickness may be removed together.

Figure 16A:
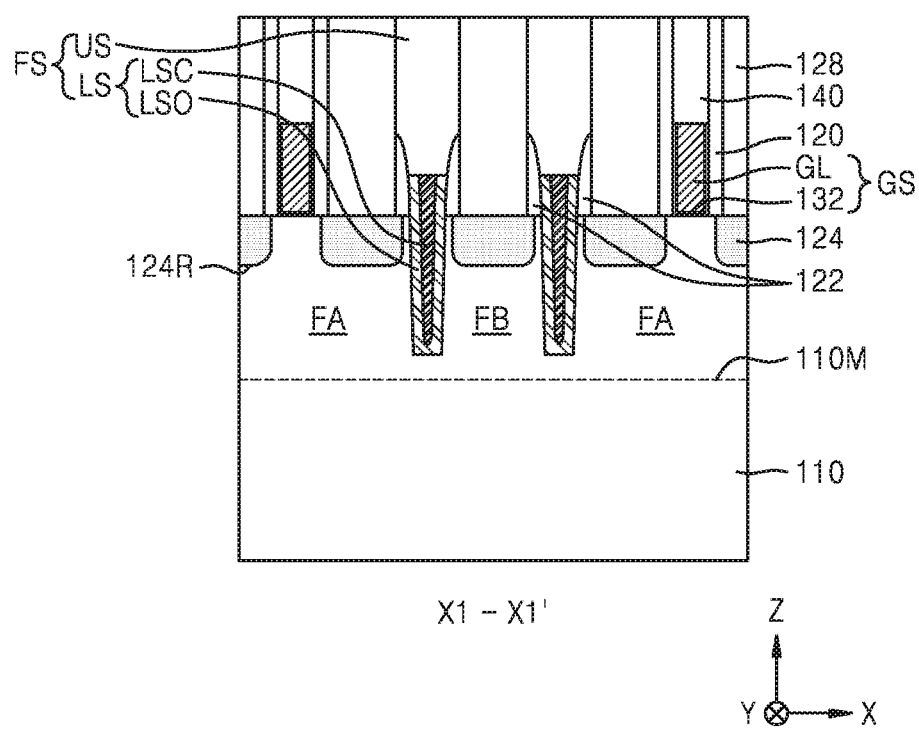
Figure 16B:
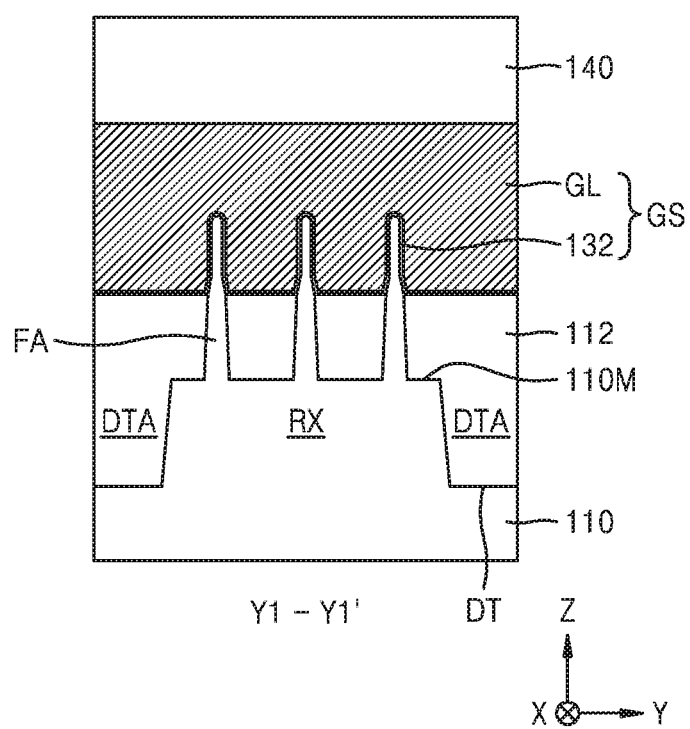
Figure 16C:
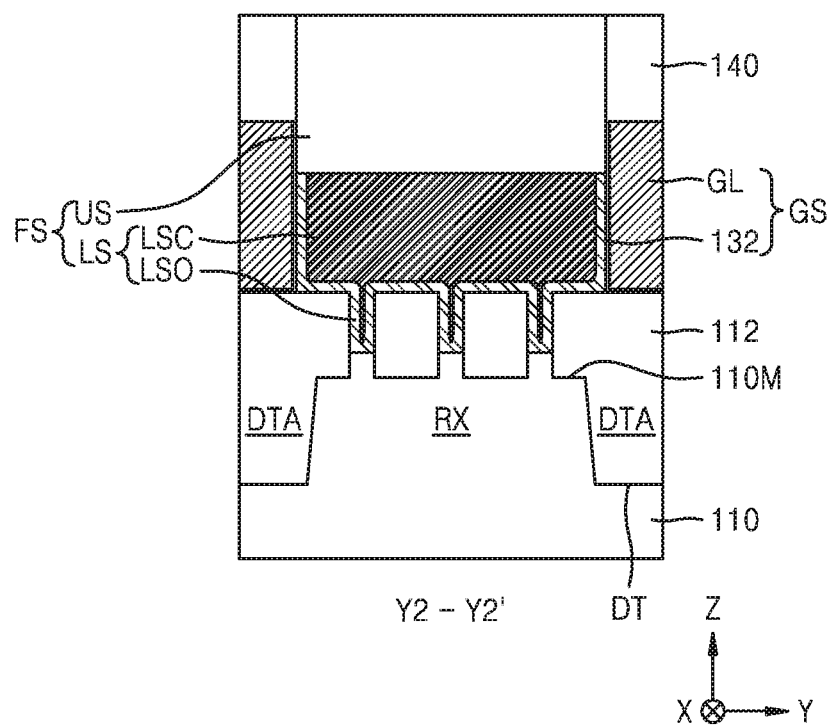

Referring to FIGS. 16A through 16C, the plurality of gate insulating capping layers 140 filling the plurality of capping spaces CS formed by the method described with reference to FIGS. 15A through 15C may be formed.

In order to form the gate insulating capping layer 140, a capping insulating layer having a sufficient thickness to fill the plurality of capping spaces CS may be formed on the substrate 110, and then, unnecessary portions of the capping insulating layer may be removed to expose a top surface of the inter-gate insulating layer 128. The gate insulating capping layer 140 may include a silicon nitride layer.

Thereafter, as illustrated in FIG. 2A, the insulating thin layer 150 and the interlayer insulating layer 160 covering the insulating thin layer 150 may be formed on an object resulting from the method described with reference to FIGS. 16A through 16C, and the plurality of conductive barrier layers 182 and the plurality of contact plugs 184 penetrating the interlayer insulating layer 160, the insulating thin layer 150, and the inter-gate insulating layer 128 and connected to the plurality of source/drain regions 124 may be formed, to form the integrated circuit device 100.

Here, by connecting the plurality of conductive barrier layers 182 and the plurality of contact plugs 184 to the plurality of source/drain regions 124 filling the plurality of recesses 124R of the plurality of first fin-type regions FA, and by not connecting the plurality of conductive barrier layers 182 and the plurality of contact plugs 184 to the plurality of source/drain regions 124 filling the plurality of recesses 124R of the plurality of second fin-type regions FB, the integrated circuit device 100a illustrated in FIG. 2B may be formed.

In some example embodiments, the insulating thin layer 150 may include a material different from the gate insulating capping layer 140. For example, when the gate insulating capping layer 140 includes a silicon nitride layer, the insulating thin layer 150 may include a silicon oxide layer. However, inventive concepts is not limited thereto. For example, the insulating thin layer 150 may include a silicon oxide layer, a silicon nitride layer, a polysilicon layer, or a combination thereof. The interlayer insulating layer 160 may include a silicon oxide layer, a silicon nitride layer, or a combination thereof.

FIGS. 17A through 17D are cross-sectional views illustrated in a process order for describing a method of manufacturing an integrated circuit device, according to some example embodiments. In detail, each of FIGS. 17A through 17D is the cross-sectional view of a portion corresponding to the line X1-X1' of FIG. 1 for describing the method of manufacturing the integrated circuit device 100a of FIG. 2C.

Figure 17A:
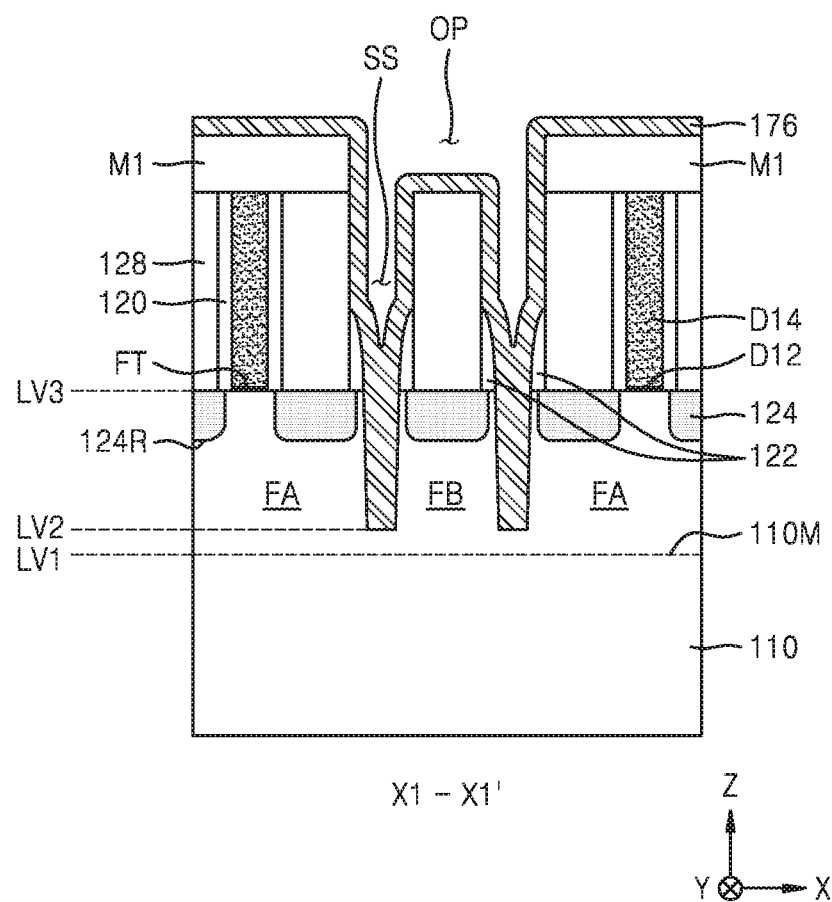
FIGS. 17A through 17D are cross-sectional views for describing a method of manufacturing an integrated circuit device, according to some example embodiments, the cross-sectional views being illustrated in a sequential order of the method.

Referring to FIG. 17A, a lower fin-isolation insulating layer 176 conformally covering an inner surface of the fin-isolation space SS formed by the method described with reference to FIGS. 7A through 7C may be formed. The lower fin-isolation insulating layer 176 may cover both a top surface and a side surface of the mask pattern M1. The lower fin-isolation insulating layer 176 may include, for example, a nitride layer or an oxide layer. The lower fin-isolation insulating layer 176 may be formed by using an ALD process. The lower fin-isolation insulating layer 176 may be formed to fill a lower portion of the fin-isolation spaces SS. The lower fin-isolation insulating layer 176 may fill from a bottom surface of the fin-isolation spaces SS to a level at least higher than the vertical level LV3 of the uppermost surface FT of the fin-type active regions FA and FB.

Figure 17B:
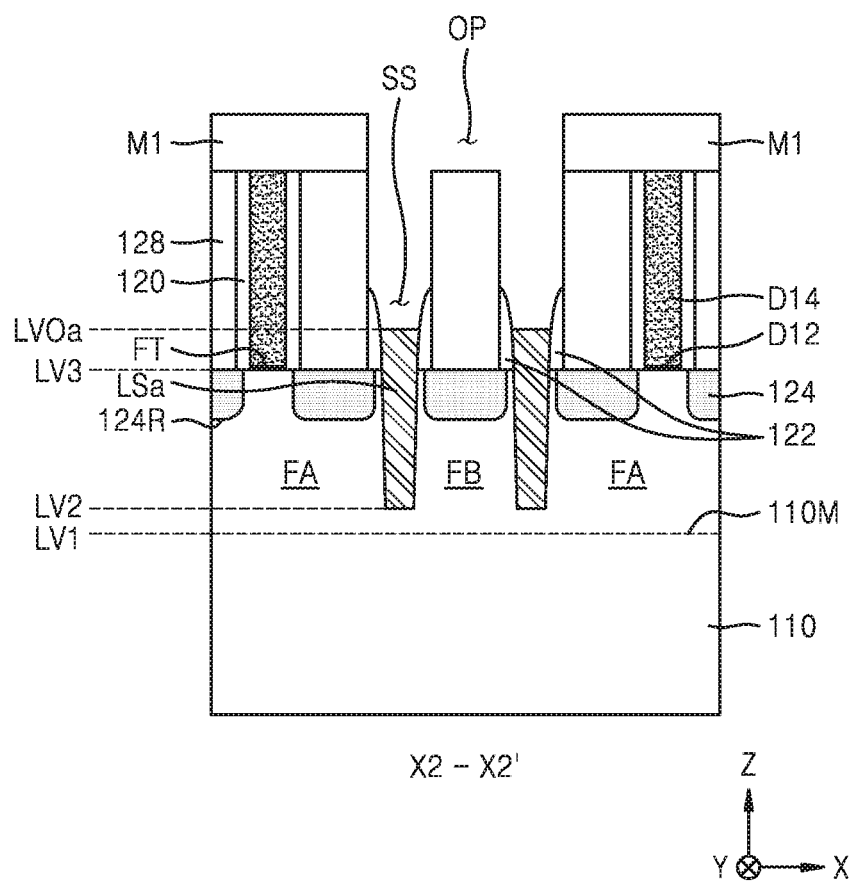

Referring to FIG. 17B, an upper portion of the lower fin-isolation insulating layer 176 formed by the method described with reference to FIG. 17A may be removed to form the lower fin-isolation insulating portion LSa. In order to form the lower fin-isolation insulating portion LSa, the upper portion of the lower fin-isolation insulating layer 176 may be removed by using a wet etch process and a dry etch process.

The vertical level LVOa of the uppermost surface of the lower fin-isolation insulating portion LSa may be higher than the vertical level LV3 of the uppermost surface FT of the fin-type active regions FA and FB and may be lower than the vertical level of the uppermost surface of the dummy gate line D14.

Figure 17C:
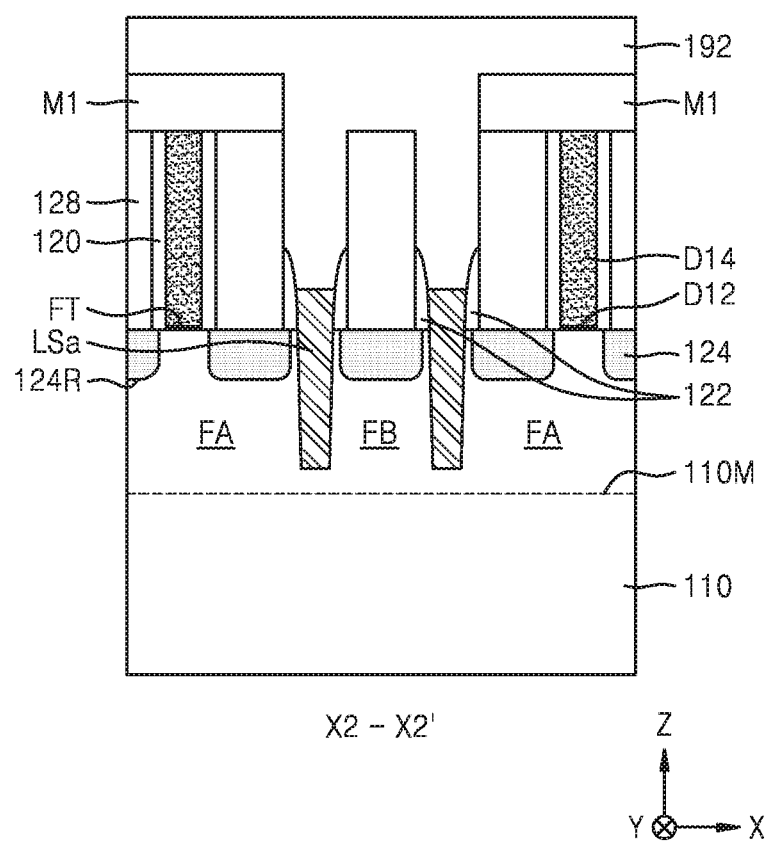

Referring to FIG. 17C, the gap-fill insulating layer 192 filling all of the fin-isolation spaces SS may be formed on an object resulting from the method described with reference to FIG. 17B. The gap-fill insulating layer 192 may be formed to fill all of the fin-isolation spaces SS and to cover both the top surface and the side surface of the mask pattern M1.

Figure 17D:
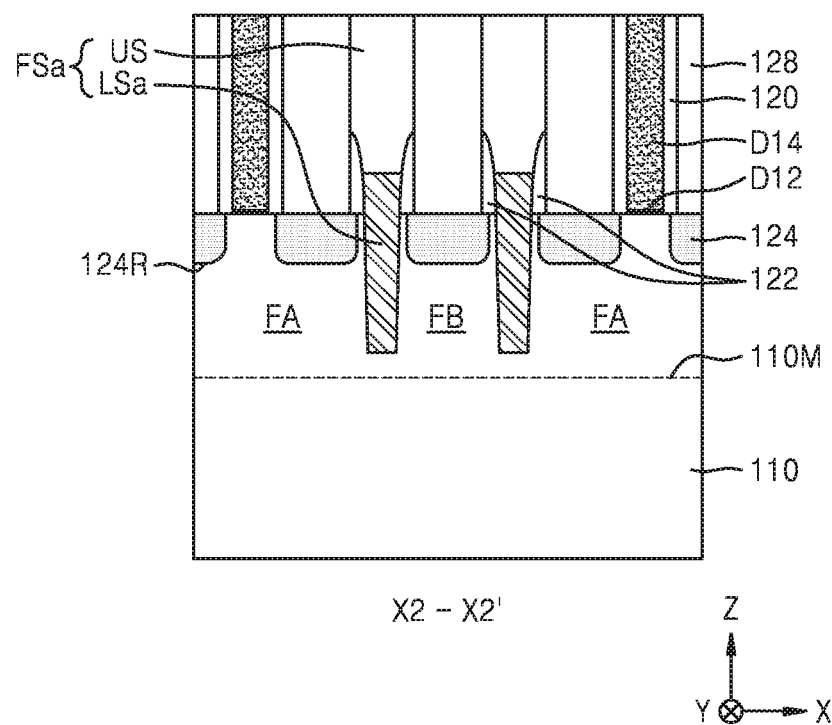

Referring to FIG. 17D together, the gap-fill insulating layer 192 formed by the method described with reference to FIG. 17C may be planarized to expose the top surface of the dummy gate line D14, to form the upper fin-isolation insulating portion US. The upper fin-isolation insulating portion US and the lower insulating pattern LSa may together form the fin-isolation insulating portion FSa.

Thereafter, the manufacturing method described with reference to FIGS. 13A through 16C may be performed to form the integrated circuit device 100b illustrated in FIG. 2C or the integrated circuit device 100c illustrated in FIG. 2D.

Figure 18A:
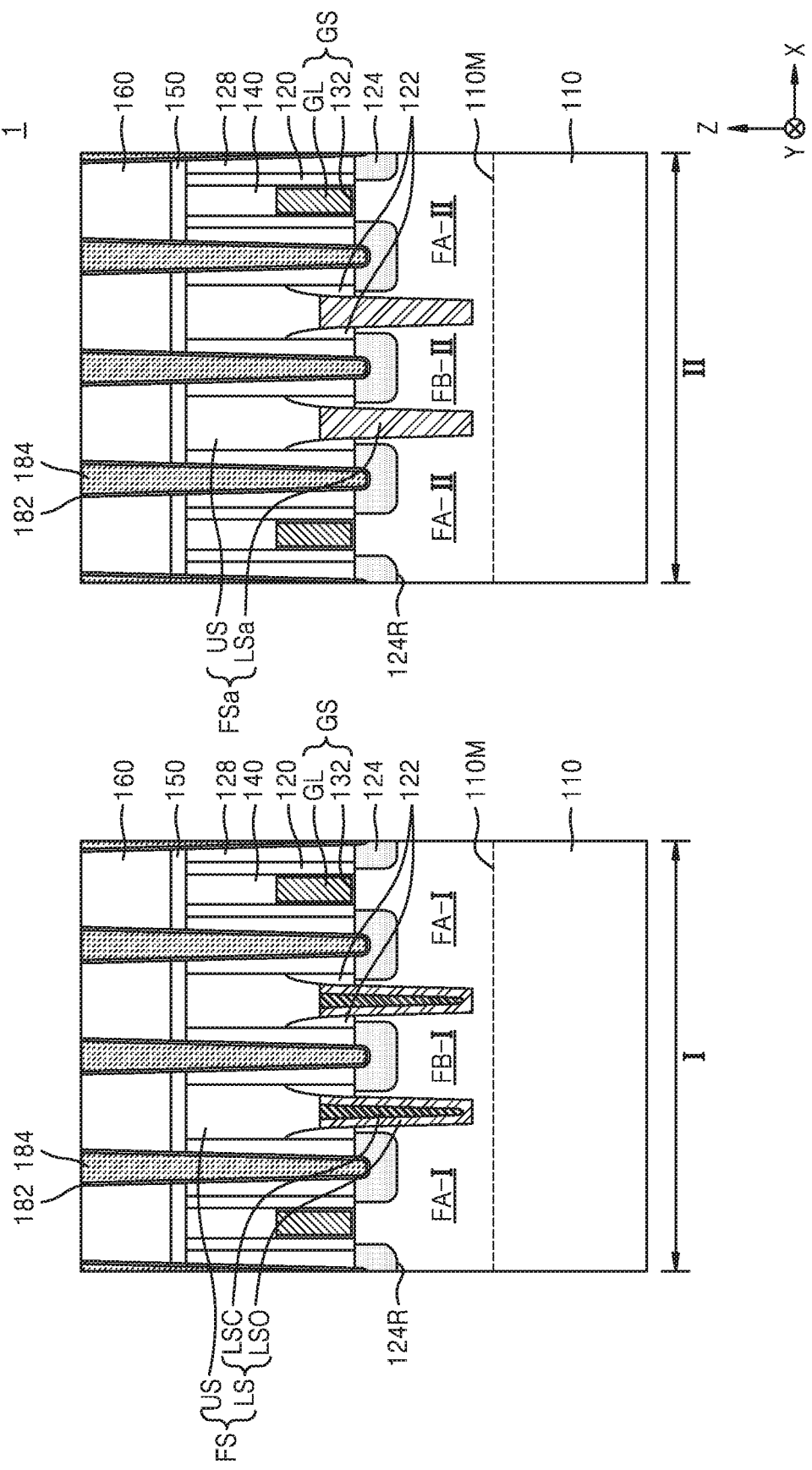
FIGS. 18A through 18C are cross-sectional views for describing integrated circuit devices according to some example embodiments.
Figure 18B:
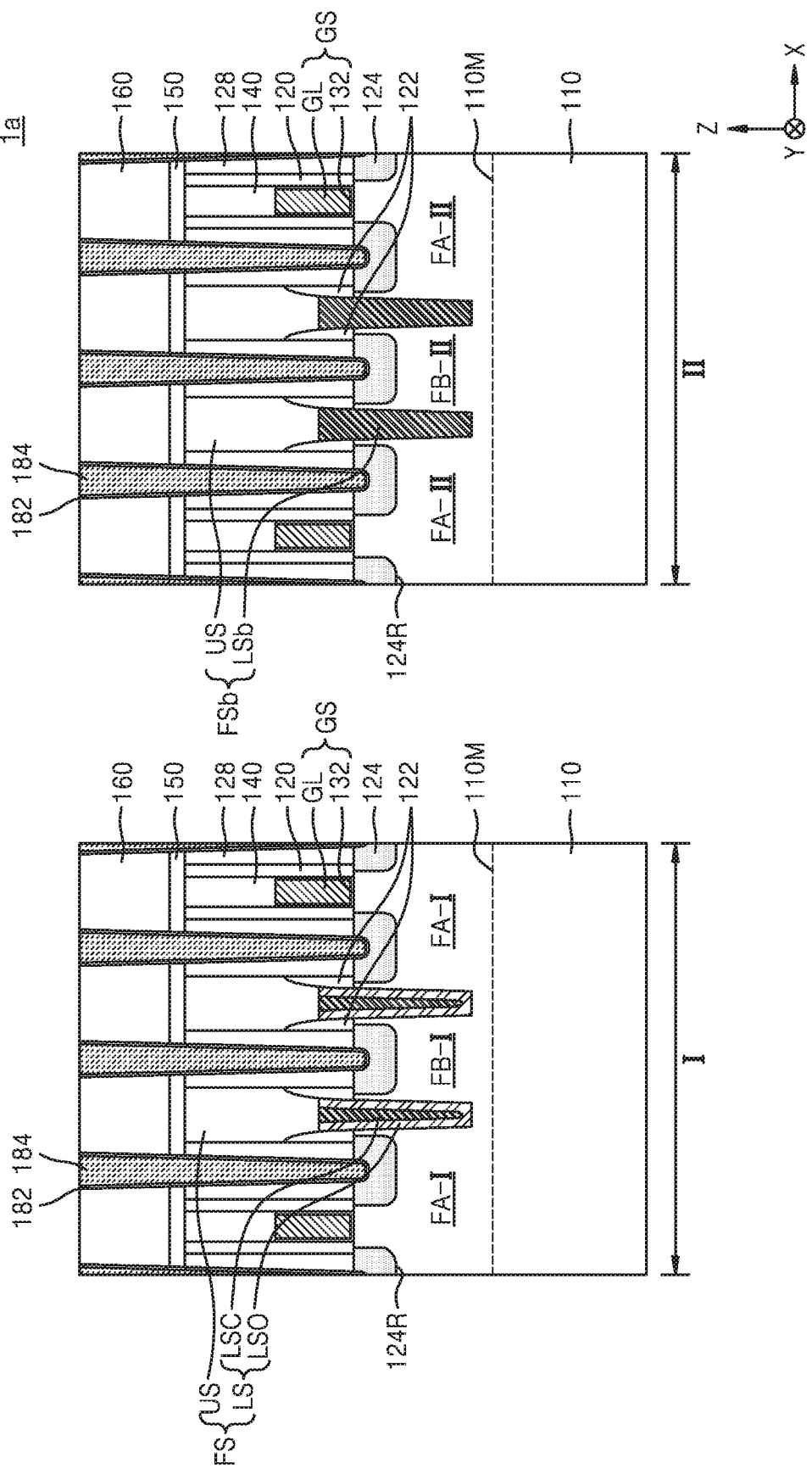
Figure 18C:
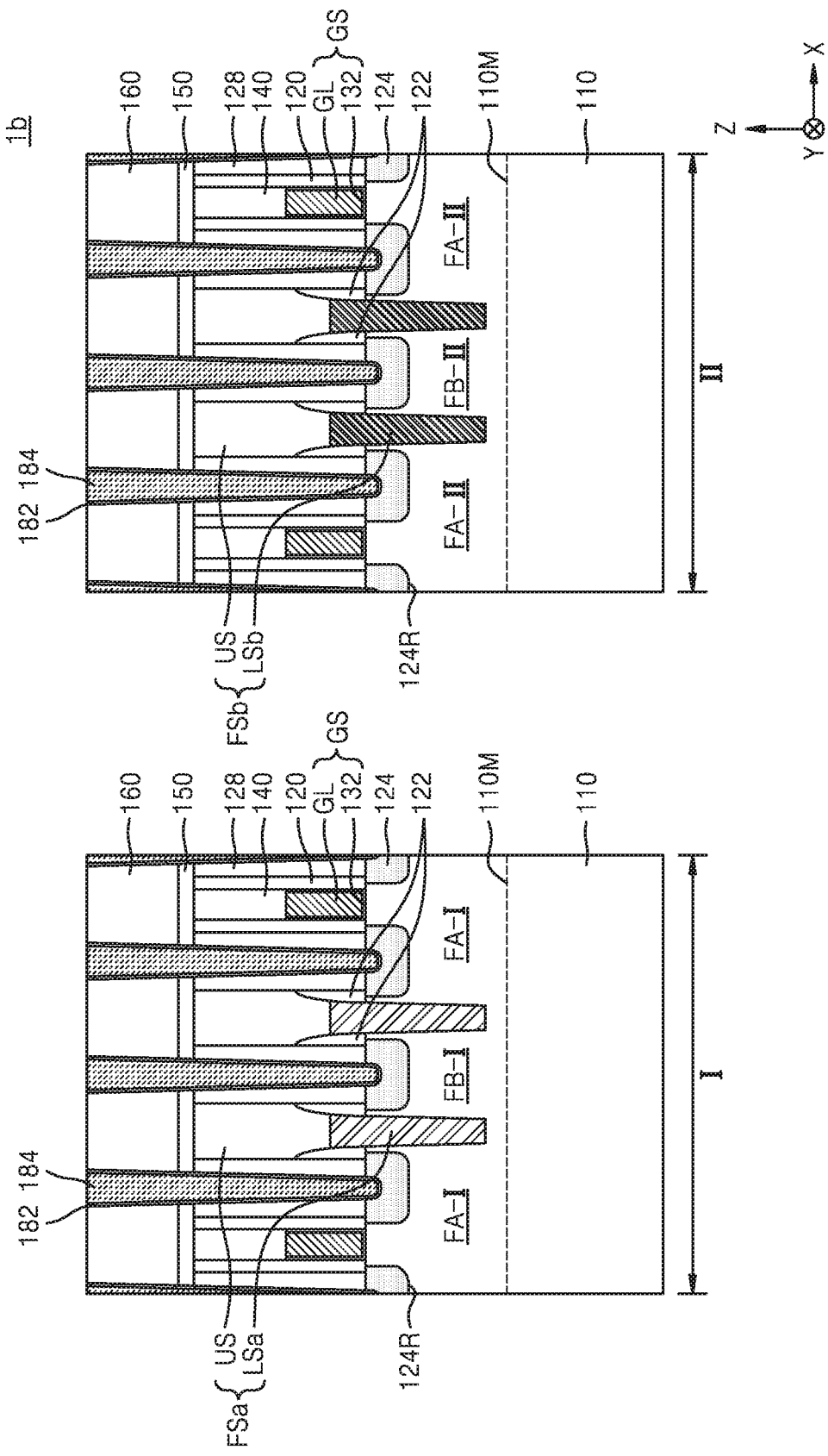

FIGS. 18A through 18C are cross-sectional views for describing integrated circuit devices according to some example embodiments. Like reference numerals in FIGS. 1 through 2D refer to like elements in FIGS. 18A through 18C, and thus, their detailed descriptions will be omitted.

Referring to FIG. 18A, an integrated circuit device 1 may have a first region I and a second region II.

MOS transistors having a 3d structure in which different conductive-type channels are formed along the plurality of gate structures GS may be formed in each of a plurality of fin-type active regions FA-I and FB-I in the first region I and a plurality of fin-type active regions FA-II and FB-II in the second region II. For example, a plurality of pMOS transistors may be formed along the plurality of gate structures GS in the first region I, and a plurality of nMOS transistors may be formed along the plurality of gate structures GS in the second region II. Alternatively, for example, a plurality of nMOS transistors may be formed along the plurality of gate structures GS in the first region I, and a plurality of pMOS transistors may be formed along the plurality of gate structures GS in the second region II.

In some example embodiments, MOS transistors having a 3d structure in which the same conductive-type channels are formed along the plurality of gate structures GS, the same conductive-type channels having different characteristics, may be formed in each of the plurality of fin-type active regions FA-I and FB-I in the first region I and the plurality of fin-type active regions FA-II and FB-II in the second region II. Alternatively, for example, the plurality of MOS transistors formed along the plurality of gate structures GS in the first region I and the plurality of MOS transistors formed along the plurality of gate structures GS in the second region II may have a different operational speed and/or a different operational voltage from each other.

At least a portion of the fin-isolation insulating portion FS formed in the first region I and at least a portion of the fin-isolation insulating portion FSa formed in the second region II may have a different material from each other. The fin-isolation insulating portion FS formed in the first region I may include the lower fin-isolation insulating portion LS and the upper fin-isolation insulating portion US on the lower fin-isolation insulating portion LS. The fin-isolation insulating portion FSa formed in the second region II may include the lower fin-isolation insulating portion LSa and the upper fin-isolation insulating portion US on the lower fin-isolation insulating portion LSa.

The fin-isolation insulating portion FS, the lower fin-isolation insulating portion LS, and the upper fin-isolation insulating portion US, in the first region I, may be referred to as a first fin-isolation insulating portion, a first lower fin-isolation insulating portion, and a first upper fin-isolation insulating portion, respectively. The fin-isolation insulating portion FSa, the lower fin-isolation insulating portion LSa, and the upper fin-isolation insulating portion US, in the second region II, may be referred to as a second fin-isolation insulating portion, a second lower-fin separating insulating portion, and a second upper fin-isolation insulating portion, respectively.

In some example embodiments, the upper fin-isolation insulating portions US formed in each of the first region I and the second region II may include an oxide layer.

The lower fin-isolation insulating portion LS formed in the first region I may include the core insulating pattern LSC and the peripheral insulating pattern LSO covering side surfaces and a bottom surface of the core insulating pattern LSC. The core insulating pattern LSC and the peripheral insulating pattern LSO formed in the first region I may include a different material from each other. In some example embodiments, the peripheral insulating pattern LSO may include a nitride layer and the core insulating pattern LSC may include an oxide layer.

The lower fin-isolation insulating portion LSa formed in the second region II may include the same material as the peripheral insulating pattern LSO formed in the first region I. In some example embodiments, the peripheral insulating pattern LSO formed in the first region I and the lower fin-isolation insulating portion LSa formed in the second region II may include a nitride layer.

In the integrated circuit device 1 according to inventive concepts, at least a portion of the fin-isolation insulating portion FS formed in the first region I and at least a portion of the fin-isolation insulating portion FSa formed in the second region II may have a different material from each other. Thus, the integrated circuit device 1 may separately and minutely control the characteristics of the MOS transistors formed in the first region I and the MOS transistors formed in the second region II, and thus, may provide the improved performance.

Referring to FIG. 18B, an integrated circuit device 1a may have the first region I and the second region II. At least a portion of the fin-isolation insulating portion FS formed in the first region I and at least a portion of a fin-isolation insulating portion FSb formed in the second region II may have a different material from each other.

The fin-isolation insulating portion FS formed in the first region I may include the lower fin-isolation insulating portion LS and the upper fin-isolation insulating portion US on the lower fin-isolation insulating portion LS. The fin-isolation insulating portion FSb formed in the second region II may include a lower fin-isolation insulating portion LSb and the upper fin-isolation insulating portion US on the lower fin-isolation insulating portion LSb.

In some example embodiments, the upper fin-isolation insulating portions US formed in each of the first region I and the second region II may include an oxide layer.

The lower fin-isolation insulating portion LS formed in the first region I may include the core insulating pattern LSC and the peripheral insulating pattern LSO covering side surfaces and a bottom surface of the core insulating pattern LSC.

The lower fin-isolation insulating portion LSb formed in the second region II may include the same material as the core insulating pattern LSC formed in the first region I. In some example embodiments, the core insulating pattern LSC formed in the first region I and the lower fin-isolation insulating portion LSb formed in the second region II may include an oxide layer.

In the integrated circuit device 1a according to inventive concepts, at least a portion of the fin-isolation insulating portion FS formed in the first region I and at least a portion of the fin-isolation insulating portion FSb formed in the second region II may have a different material from each other. Thus, the integrated circuit device 1a may separately and minutely control the characteristics of the MOS transistor formed in the first region I and the MOS transistor formed in the second region II, and thus, may provide the improved performance.

Referring to FIG. 18C, an integrated circuit device 1b may have the first region I and the second region II. At least a portion of the fin-isolation insulating portion FSa formed in the first region I and at least a portion of the fin-isolation insulating portion FSb formed in the second region II may have a different material from each other.

The fin-isolation insulating portion FSa formed in the first region I may include the lower fin-isolation insulating portion LSa and the upper fin-isolation insulating portion US on the lower fin-isolation insulating portion LSa. The fin-isolation insulating portion FSb formed in the second region II may include the lower fin-isolation insulating portion LSb and the upper fin-isolation insulating portion US on the lower fin-isolation insulating portion LSb.

In some example embodiments, the upper fin-isolation insulating portions US formed in each of the first region I and the second region II may include an oxide layer.

The lower fin-isolation insulating portion LSa formed in the first region I and the lower fin-isolation insulating portion LSb formed in the second region II may include a different material from each other. In some example embodiments, the core insulating pattern LSC formed in the first region I may include a nitride layer and the lower fin-isolation insulating portion LSb formed in the second region II may include an oxide layer.

In the integrated circuit device 1b according to inventive concepts, at least a portion of the fin-isolation insulating portion FSa formed in the first region I and at least a portion of the fin-isolation insulating portion FSb formed in the second region II may have a different material from each other. Thus, the integrated circuit device 1b may separately and minutely control the characteristics of the MOS transistor formed in the first region I and the MOS transistor formed in the second region II, and thus, may provide the improved performance.

FIGS. 18A through 18C illustrate that the plurality of conductive barrier layers 182 and the plurality of contact plugs 184 are connected to the plurality of source/drain regions 124 filling the plurality of recesses 124R of the plurality of first fin-type areas FA and to the plurality of source/drain regions 124 filling the plurality of recesses 124R of the plurality of second fin-type regions FB. However, inventive concepts is not limited thereto. AS illustrated in FIGS. 2B and 2D, the plurality of conductive barrier layers 182 and the plurality of contact plugs 184 may be formed to be connected to the plurality of source/drain regions 124 filling the plurality of recesses 124R of the plurality of first fin-type regions FA and not to be connected to the plurality of source/drain regions 124 filling the plurality of recesses 124R of the plurality of second fin-type regions FB.

Figure 19:
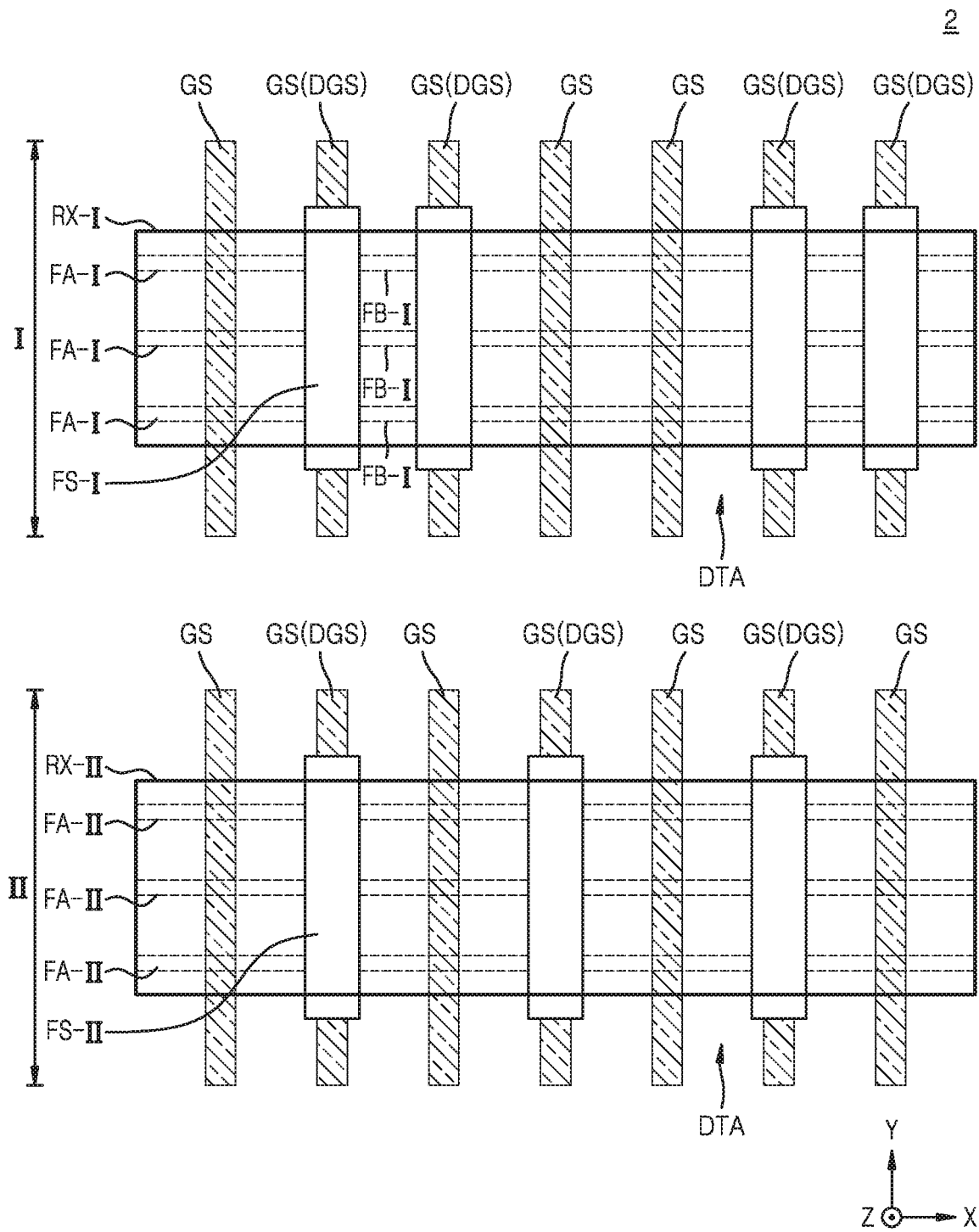
FIG. 19 is a planar layout diagram for describing an integrated circuit device according to other embodiments.

FIG. 19 is a planar layout diagram for describing an integrated circuit device 2 according to some example embodiments.

Referring to FIG. 19, the integrated circuit device 2 may have the first region I and the second region II.

Two fin-isolation insulating portions FS-I may be between the gate structures GS in an element region RX-I of the first region I. Two gate structures GS and two fin-isolation insulating portions FS-I may be alternately in the element region RX-I of the first region I in the first direction (the X direction).

Two fin-isolation insulating portions FS-II may be between the gate structures GS in an element region RX-II of the first region II. One gate structure GS and one fin-isolation insulating portion FS-II may be alternately in the element region RX-II of the second region II in the first direction (the X direction).

The fin-isolation insulating portions FS-I in the first region I may apply a tensile stress or a compressive stress to channel areas of fin-type active regions FA-I and FB-I adjacent to a side of the fin-isolation insulating portion FS-I, and the fin-isolation insulating portion FS-II in the second region II may apply a tensile stress or a compressive stress to channel areas of fin-type active regions FA-II adjacent to both sides of the fin-isolation insulating portion FS-II. Thus, the stress applied by the fin-isolation insulating portions FS-I to a plurality of MOS transistors formed along the gate structures GS in the first region I may be different from the stress applied by the fin-isolation insulating portion FS-II to a plurality of MOS transistors formed along the gate structures GS in the second region II.

Thus, the integrated circuit device 2 may separately and minutely control the characteristics of the MOS transistors formed in the first region I and the MOS transistors formed in the second region II, and thus, may provide the improved performance.

While inventive concepts have been particularly shown and described with reference to some example embodiments thereof, it will be understood that various changes in form and details may be made therein without departing from the spirit and scope of the following claims.

What is claimed is:

1. An integrated circuit device comprising:
    a substrate;
    a plurality of fin-type active regions protruding from the substrate, the plurality of fin-type active regions extending in parallel to one another in a first direction; and
    a plurality of gate structures and a plurality of fin-isolation insulating portions extending on the substrate in a second direction crossing the first direction, the plurality of gate structures and the plurality of fin-isolation insulating portions at a constant pitch in the first direction,
    wherein a pair of fin-isolation insulating portions from among the plurality of fin-isolation insulating portions are between a first element of a pair of gate structures and a second element of the pair of gate structures, the pair of gate structures being from among the plurality of gate structures,
    the plurality of fin-type active regions comprise a plurality of first fin-type regions and a plurality of second fin-type regions, wherein a pair of first fin-type regions from among the plurality of first fin-type regions extend in a straight line in the first direction and are spaced apart from each other with the pair of fin-isolation insulating portions therebetween, and one of the plurality of second fin-type regions is between the pair of fin-isolation insulating portions, and
    a lowermost surface of at least one of the plurality of fin-isolating insulating portion is separate from a topmost surface of the substrate.

2. The integrated circuit device of claim 1, wherein each of the plurality of fin-isolation insulating portions comprises a lower fin-isolation insulating portion and an upper fin-isolation insulating portion on the lower fin-isolation insulating portion, wherein the lower fin-isolation insulating portion is aligned in a vertical direction with respect to the upper fin-isolation insulating portion, and at least a portion of the lower fin-isolation insulating portion and at least a portion of the upper fin-isolation insulating portion have a different material from each other, and
    a width of at least a portion of the upper fin-isolation insulating portion in the first direction is greater than a width of the plurality of gate structures in the first direction.

3. The integrated circuit device of claim 2, wherein a vertical level of each of a lowermost surface and an uppermost surface of the lower fin-isolation insulating portion is lower than a vertical level of each of an uppermost surface of the plurality of fin-type active regions and an uppermost surface of the plurality of gate structures.

4. The integrated circuit device of claim 2, wherein the lower fin-isolation insulating portion comprises,
    a core insulating pattern, and
    a peripheral insulating pattern covering side surfaces and a bottom surface of the core insulating pattern.

5. The integrated circuit device of claim 4, wherein the core insulating pattern comprises an oxide layer and the peripheral insulating pattern comprises a nitride layer.

6. The integrated circuit device of claim 2, wherein the lower fin-isolation insulating portion comprises a single material.

7. The integrated circuit device of claim 1, further comprising:
    a plurality of first insulating spacers covering both side walls of the plurality of gate structures; and
    a plurality of second insulating spacers covering both side walls of the plurality of fin-isolation insulating portions,
    wherein an uppermost surface of the plurality of second insulating spacers is at a lower vertical level than an uppermost surface of the plurality of first insulating spacers.

8. The integrated circuit device of claim 1, wherein the plurality of gate structures comprise a pair of dummy gate structures extending in a straight line in the second direction with the plurality of fin-isolation insulating portions therebetween.

9. The integrated circuit device of claim 1, wherein an uppermost surface of the plurality of fin-isolation insulating portions is at a higher vertical level than an uppermost surface of the plurality of gate structures.

10. The integrated circuit device of claim 9, further comprising:
    a plurality of gate insulating capping layers covering a top surface of the plurality of gate structures,
    wherein an uppermost surface of the plurality of gate insulating capping layers and the uppermost surface of the plurality of fin-isolation insulating portions have a same vertical level.

11. The integrated circuit device of claim 1, further comprising:
    a plurality of source/drain regions on the plurality of fin-type active regions at both sides of the plurality of gate structures and both sides of the plurality of fin-isolation insulating portions; and
    a plurality of contact plugs connected to the plurality of source/drain regions.

12. The integrated circuit device of claim 11, wherein the plurality of contact plugs vertically overlap the plurality of first fin-type regions and do not vertically overlap the plurality of second fin-type regions.

13. An integrated circuit device comprising:
a substrate;
a plurality of fin-type active regions protruding from the substrate, the plurality of fin-type active regions having a first region and a second region, the plurality of fin-type active regions extending in parallel to one another in a first direction; and
a plurality of gate structures and a plurality of fin-isolation insulating portions extending on the substrate in a second direction crossing the first direction, the plurality of gate structures and the plurality of fin-isolation insulating portions at a constant pitch in the first direction,
wherein a pair of fin-isolation insulating portions from among the plurality of fin-isolation insulating portions are between a first element and a second element of a pair of gate structures from among the plurality of gate structures, and
the plurality of fin-isolation insulating portions comprise a first fin-isolation insulating portion in the first region and a second fin-isolation insulating portion in the second region, wherein at least a portion of the first fin-isolation insulating portion has a different material from at least a portion of the second fin-isolation insulating portion.

14. The integrated circuit device of claim 13, wherein
the first fin-isolation insulating portion comprises a first lower fin-isolation insulating portion and a first upper fin-isolation insulating portion on the first lower fin-isolation insulating portion,
the second fin-isolation insulating portion comprises a second lower fin-isolation insulating portion and a second upper fin-isolation insulating portion on the second lower fin-isolation insulating portion,
an uppermost surface of each of the first lower fin-isolation insulating portion and the second lower fin-isolation insulating portion is at a higher vertical level than an uppermost surface of the plurality of fin-type active regions and is at a lower vertical level than the plurality of gate structures,
the first upper fin-isolation insulating portion has the same material as the second upper fin-isolation insulating portion, and
at least a portion of the first lower fin-isolation insulating portion has a different material than at least a portion of the second lower fin-isolation insulating portion.

15. The integrated circuit device of claim 14, wherein
the first lower fin-isolation insulating portion comprises a core insulating pattern and a peripheral insulating pattern covering side surfaces and a bottom surface of the core insulating pattern, the core insulating pattern having a different material from the peripheral insulating pattern, and
the second lower fin-isolation insulating portion consists of a single material.

16. The integrated circuit device of claim 15, wherein the peripheral insulating pattern and the second lower fin-isolation insulating portion include a same material.

17. The integrated circuit device of claim 15, wherein the core insulating pattern and the second lower fin-isolation insulating portion include a same material.

18. The integrated circuit device of claim 13, further comprising:
a plurality of first insulating spacers covering both side walls of the plurality of gate structures; and
a plurality of second insulating spacers covering both side walls of the plurality of fin-isolation insulating portions,
wherein an uppermost surface of the plurality of second insulating spacers is at a lower vertical level than an uppermost surface of the plurality of first insulating spacers, and
an uppermost surface of the plurality of fin-isolation insulating portions is at a higher vertical level than an uppermost surface of the plurality of gate structures.

19. An integrated circuit device comprising:
a substrate;
a plurality of fin-type active regions protruding from the substrate, the plurality of fin-type active regions having a first region and a second region, the second region separate from the first region, and the plurality of fin-type active regions extending in parallel to one another in a first direction; and
a plurality of gate structures and a plurality of fin-isolation insulating portions extending on the substrate in a second direction crossing the first direction and at a constant pitch in the first direction,
wherein a pair of fin-isolation insulating portions from among the plurality of fin-isolation insulating portions are between a first element and a second element of a pair of gate structures from among the plurality of gate structures in the first region, and
one fin-isolation insulating portion from among the plurality of fin-isolation insulating portions is between a pair of gate structures from among the plurality of gate structures in the second region.

20. The integrated circuit device of claim 19, wherein
a lowermost surface of the plurality of fin-isolation insulating portions is at a lower vertical level than an uppermost surface of the plurality of fin-type active regions, and
an uppermost surface of the plurality of fin-isolation insulating portions is at a higher vertical level than an uppermost surface of the plurality of gate structures.

* * * * *